(12) United States Patent
Jereminov et al.

(10) Patent No.: US 11,748,528 B1
(45) Date of Patent: Sep. 5, 2023

(54) SYSTEMS, METHODS, AND SOFTWARE FOR IDENTIFICATION AND APPLICATION OF PHYSICAL MITIGATIONS IN PLANNING AND OPERATING AN ELECTRICAL POWER GRID

(71) Applicant: Pearl Street Technologies, Inc., Pittsburgh, PA (US)

(72) Inventors: Marko Jereminov, Pittsburgh, PA (US); David Bromberg, Pittsburgh, PA (US); Hui Zheng, Round Rock, TX (US)

(73) Assignee: Pearl Street Technologies, Inc., Pittsburgh, PA (US)

( * ) Notice: Subject to any disclaimer, the term of this patent is extended or adjusted under 35 U.S.C. 154(b) by 0 days.

(21) Appl. No.: 17/742,008

(22) Filed: May 11, 2022

(51) Int. Cl.
*G06F 30/18* (2020.01)
*G06Q 50/06* (2012.01)
*G06F 30/20* (2020.01)

(52) U.S. Cl.
CPC .............. *G06F 30/18* (2020.01); *G06F 30/20* (2020.01); *G06Q 50/06* (2013.01)

(58) Field of Classification Search
CPC .......... G06F 30/18; G06F 30/20; G06Q 50/06
USPC ......................................................... 703/18
See application file for complete search history.

(56) References Cited

U.S. PATENT DOCUMENTS

| 8,874,477 | B2 * | 10/2014 | Hoffberg | G06Q 20/22 |
| | | | | 705/37 |
| 2017/0364043 | A1 * | 12/2017 | Ganti | G05B 17/02 |
| 2018/0269681 | A1 * | 9/2018 | Vaiman | G05B 15/02 |

OTHER PUBLICATIONS

PowerWorld (Interactive power system simulation, analysis and visualization, (1376 pages)). (Year: 2001).*
Nie et al. (Optimization of electric power systems with cost minimization and environmental-impact mitigation under multiple uncertainties, 19 pages. (Year: 2018).*

* cited by examiner

*Primary Examiner* — Andre Pierre Louis
(74) *Attorney, Agent, or Firm* — David Garrod, Esq.

(57) ABSTRACT

Reliable, automated or semi-automated systems/methods that address technical problems involved in electrical power grid design, planning, and operation/control are disclosed. Applications include the technical problem of optimizing adjustments of, and/or infrastructure additions to, large electrical power grids in response to changed operating conditions or planned facility additions that may impact their reliability. An automated or semi-automated system for identifying appropriate adjustments to the electrical power grid and/or addition of new facilities, and the methods and executable computer instructions that enable them, are disclosed.

18 Claims, 17 Drawing Sheets

SYSTEMS, METHODS, AND SOFTWARE FOR IDENTIFICATION AND APPLICATION OF PHYSICAL MITIGATIONS IN PLANNING AND OPERATING AN ELECTRICAL POWER GRID

STATEMENT OF GOVERNMENT SUPPORT

This invention was made, in part, with government support under Small Business Innovation Research Grant No. 1951083, awarded by the National Science Foundation. As a result, the government may have certain rights in this invention.

FIELD OF THE INVENTION

This invention relates to certain technical problems involved in electrical power grid design, planning, and operation/control. In particular, aspects of this invention relate to the technical problem of optimizing adjustments of, and/or infrastructure additions to, large electrical power grids in response to operating conditions or planned facility additions that may impact their reliability. An automated or semi-automated system for identifying appropriate adjustments to the electrical power grid and/or addition of new facilities, and the methods and executable computer instructions that enable them, are disclosed.

BACKGROUND OF THE INVENTION

An electrical power grid is a physical system operated continuously to balance electrical load (power consumption) and electrical generation (FIG. 1). Reliable and resilient operation of the electrical power grid is considered an essential service in modern society, and is therefore a cornerstone of economic health and social good.

Planning the future of an electrical power grid, as well as real-time operation of the grid, generally involves simulation of one or more changes to the system in order to determine how the rest of the system needs to adapt to these changes. The set of adaptations are often referred to as "mitigations." In the context of long-term planning, electric utilities and grid operators may model the addition of new renewable generation facilities (e.g., solar, wind) and/or the retirement of older power plants, and then seek to understand how to adjust the power output of existing generation plants (a process known as "redispatch") and/or where to build new power transmission infrastructure to support the added generation. In real-time operation of a grid, operators typically simulate hundreds or thousands of potential outage conditions to determine if it would be possible to adjust the operating conditions (e.g., generation output, electrical breaker statuses, etc.) to maintain reliable operation of the grid if a particular outage were to occur.

Determining the types and magnitudes of adjustments to accommodate planned or operational changes is generally a manual process. Typically, an experienced electrical power grid planning engineer uses a simulation software program to model the impact of new solar and wind generation on grid reliability, observes "violations" (unacceptably high power flows on existing transmission lines, low system voltages, etc.) and proposes upgrades to existing facilities or construction of new facilities to mitigate these issues. The selected mitigations may resolve the issues observed in simulation, but they may not be the most cost-effective or energy-efficient solution, and the selection process heavily depends on the engineer's experience and intuition.

Determining cost-effective mitigations to grid reliability concerns in response to interconnections of new solar and wind generation is of growing concern in the United States and abroad, particularly doing so in an automated or semi-automated, repeatable, time-efficient way. Requests for interconnection of new renewable generation and battery energy storage systems have been growing, and as of 2021, there is already a backlog of more than 700 GW of proposed projects that have yet to be studied and/or constructed. Creating models of the grid with these proposed projects included, and then identifying the mitigations (typically adjustment of existing generation and addition of new facilities, such as transmission lines, transformers, or capacitor banks) is a large factor that contributes to the backlog, as these analyses may take many months of engineering effort and are frequently repeated as new information becomes available or errors are identified. As noted above, the selection of mitigations is generally a manual process, and one that has significant cost implications. For example, if the planning engineers conducting the study suggest a new transmission line must be built to accommodate one or more new generation interconnections, they are effectively proposing the developers of those projects take on tens to hundreds of millions of dollars of added costs to make their interconnections viable. The time it takes for a proposed generation project to be studied and approved, as well as the very high cost of proposed mitigations identified during the studies, are a limiting factor in the transition to a decarbonized power system.

Attempts to automate identification and/or application of necessary changes to the grid have been made. For example, planning and operations engineers often employ automation scripts to apply an event to a simulation model, simulate its effects, and then apply one or more pre-selected actions (e.g., opening/closing of transmission lines, adjustment of system generation, shedding/reduction of electrical load, etc.) to "resolve" any reliability problems that occur. This process, however, represents a "guess and check" methodology that does not optimally resolve the underlying issues, and frequently does not resolve them at all. Therefore, these sorts of guesswork approaches, which rely on "hard-coded" actions that are not adapted in response to case-specific conditions, fail to effectively address the industry's current and increasingly critical need for a better, more reliable method of planning and implementing physical adaptations in large-scale power grids.

SUMMARY OF THE INVENTION

The invention, as outlined below, provides an efficient and effective solution to grid adaptation problems of a scale that are current approaches cannot effectively address. As such, the invention represents an important step in the integration and utilization of renewable generation sources into the public power grid.

In order to fully enable persons of skill in the art to make and use the full scope of the invention for its intended technological applications in power grid planning and management, the inventors have provided a comprehensive explanation of certain theoretical principles on which the invention is based. It should be understood, however, that the intent here is to enable the practical application of this invention as claimed, not to in any way claim as our invention the mathematical principles or abstractions on which the invention's improved performance and reliability is/are based.

Overview

A principal object of the invention described herein is to automate, partly or wholly, the identification and application of mitigations that resolve reliability and/or feasibility issues within an electrical power grid. Use cases include, but are not limited to, automatic and/or optimal adjustment of existing power generation to accommodate an influx of new proposed generation, automatic siting and/or sizing of reactive power resources (e.g., capacitor banks) to resolve low, high, or collapsed grid voltages, automatic siting of new transmission paths to resolve overloads, shedding load to prevent a blackout, and more. Preferred embodiments of the invention preferably follow a sequence of stages to sequentially solve the target objective, including:

- Importing a "base case" power grid simulation model, including connectivity/topology information, facility parameters and settings, operational limits, operational costs, and the changes to apply;
- Applying the proposed changes to the base case model;
- Solving a set of "approximate power flow" optimization problems, using models that tolerate non-physicality, to determine "responsive" adjustments or mitigations needed in light of the proposed changes to the base case;
- Solving a set of exact alternating current (AC) power flow optimization problems with models that tolerate non-physicality;
- Solving a set of AC power flow simulations to validate the output results;
- Outputting a feasible, operational grid model and a summary of adjustments made to the model across prior stages;
- Optionally outputting an instruction set to a grid operator to apply adjustments to the grid in real-time.

In the remainder of this section, we outline the enabling principles and advances that underpin the inventive system. Additional enabling details concerning the invention's preferred computational method can be found in "Equivalent Circuit Programming," Ph.D. Thesis, Carnegie Mellon University, August 2019, by one of the present inventors and incorporated herein by reference (available at https://kilthub.cmu.edu/ndownloader/files/17566859 and https://scholar.archive.org/work/oggd7vlg4rbg3gpzxzp3jfx4vm/access/wayback/https://s3-eu-west-1,amazonaws.com/pstorage-cmu-348901238291901/17566859/Jereminoy_cmu_0041E_10443.pdf).

An Example of Relaxing Conditional Model Behavior to Tolerate Non-Physicality

Consider a conditional variable $y_i$. Its behavior can also be characterized in terms of a complementarity constraint defined as:

$$y_i x_j = 0$$

$$0 \leq y_i \leq k \quad (2)$$

Namely, only if some variable $x_j = 0$, the conditional variable $y_i$ can have a value on the range $y_i \in (0, k]$, or for the relaxed binary case $k=1$.

The idea behind a model that tolerates non-physicality is to enforce the conditional complementarity characteristics (e.g., (2)) by an objective function augmentation. For example, an augmented objective function that penalizes model violations/non-physicality given by the cost coefficients given by $w_{x,2}$, $w_{x,1}$, $w_{y,2}$ and $w_{y,1}$ can be defined as:

$$\min_{x_j, y_i} \ldots + w_{x,2} x_j^2 + w_{y,2} y_i^2 + w_{x,1} x_j + w_{y,1} y_i \quad (3)$$

Preferably, this augmented objective should have the following characteristics:

a) Yield to the minimized augmented term value at the optimal solution, while ensuring that the complementarity conditions as the one in (2) hold to a certain tolerance;

b) Indicate an infeasibility in satisfying the complementarity conditions in terms of large non-negative objectives, a property the strict complementarity conditions cannot ensure.

Examples of "non-physicality," as referenced herein, include power grid scenarios and/or control/operational parameters that result in the violations of physical laws governing the operability of a power system, and/or operating conditions or parameters that exceed permitted operating limits (specifications) for the network components or exceed allowed safety limits for the components or the network as a whole. Non-limiting examples of such non-physicality may include:

1. Non-physicality of facility operational limits, including:
   a. Generators supplying real power above their maximum real power limits or below their minimum real power limits;
   b. Generators supplying reactive power above their maximum reactive power limits or below their minimum reactive power limits;
2. Non-physicality of grid control parameters, including:
   a. Conflicting voltage set-points of two or more voltage-controlling facilities (e.g., two generators set to regulate the same or nearby buses to different, incompatible levels; a switched shunt set to regulate a bus voltage within a given voltage band with another facility, such as a generator, set to regulate that same bus voltage outside the band);
3. Non-physicality of the network topology, including:
   a. Transmission lines or transformer windings with unusually high series resistance or reactance (e.g., approaching open circuits);
   b. Large shunt conductances to ground;
   c. Abnormally high or low transformer turn ratios that force bus voltages outside their operational safety ratings (e.g., stepping up voltage from primary to secondary side to an unusually high voltage, or stepping down to an unusually low voltage).

In light of the above, generally speaking, and without intending to be limiting, aspects of the invention relate to processes (e.g., 801) for physically mitigating an electrical power grid network (the "original network") to accommodate change(s) in facility parameters and/or network topology, and/or additions or retirements of facilities, such processes preferably involving one or more of the following steps: (a) receiving information sufficient to determine topology and facility parameters of the network after the change(s) to facility parameters and/or network topology, and/or additions or retirements of facilities have been applied (the "altered network"); (b) receiving information that indicates an operating state of the original network; (c) determining (e.g., 802) data errors and/or non-physical configurations from the information received in (a) and (b); (d) applying corrections to the data errors and/or non-physical configurations determined in (c); (e) determining (e.g., 806) initial responsive adjustment(s) to the altered network using model(s) that tolerate non-physicality; (f) determining (e.g., 810) final responsive adjustment(s) to the altered network using actual AC power flow optimization; and/or (g) verifying (e.g., 811) the final responsive adjustment(s) using full AC simulation of the altered network with the final responsive adjustment(s) applied. In some embodiments, determining data errors in step (c) may comprise one or more of: (i) determining whether a facility parameter is outside of physically reasonable bounds; and/or (ii) determining whether an operating state variable is outside of physically reasonable bounds. In some embodiments, determining non-physical configurations in step (c) may comprise one or more of: (i) identifying conflicting control parameters; and/or (ii) identifying conflicting transformer settings. In some embodiments, determining (e.g., 806) initial responsive adjustment(s) in step (e) may comprise: (i) performing (e.g., 910) a first-pass optimization, using a model that tolerates non-physicality, to identify portion(s) of the altered network for parameter adjustment and/or deployment of additional facilities; and (ii) performing (e.g., 920) a second-pass optimization, also using a model that tolerates non-physicality, to refine the identified parameter adjustment(s) and/or newly deployed facilities. In some embodiments, performing (e.g., 910) the first-pass optimization may comprise determining (e.g., 911) first-pass adjustment(s) to existing facilities. In some embodiments, performing (e.g., 910) the first-pass optimization may further comprise determining (e.g., 912) first-pass adjustments to the additionally deployed facilities. In some embodiments, performing (e.g., 920) the second-pass optimization may comprise refining (e.g., 921) the first-pass adjustments(s) to existing facilities. In some embodiments, performing (e.g., 920) the second-pass optimization may comprise: (i) refining (e.g., 921) the first-pass adjustments(s) to existing facilities; and (ii) refining (e.g., 922) the first-pass adjustments to the additionally deployed facilities. In some embodiments, step (e) may comprise: (i) instantiating a plurality of idealized compensatory elements at a plurality of points in the altered network; and (ii) determining parameters for the compensatory elements that compensate for non-physicality in the altered network. In some embodiments, step (e) may further comprise: (iii) performing one or more pruning steps to reduce the number of compensatory elements in the altered network. In some embodiments, each pruning step may eliminate one or more of the compensatory elements from the altered network and adjust the parameters of other compensatory element(s) to maintain physically feasible operating conditions in the altered network. In other embodiments, each pruning step may eliminate one or more of the compensatory elements from the altered network and adjust the parameters of other compensatory element(s) and/or the parameters of existing network facilities to maintain physically feasible operating conditions in the altered network. In some embodiments, each pruning step may select one or more compensatory elements to eliminate based on an automated search process, guided by a cost function. In some embodiments, the cost function may be programmed to cause the search process to favor elimination of compensatory elements that provide the least amount of feasibility compensation in the altered network. In some embodiments, each pruning step may eliminate one or more user-selected compensatory elements. In some embodiments, each pruning step may prompt a user to select one or more compensatory elements for elimination based on a graphical representation of the altered network and costs associated with the compensatory elements. In some embodiments, each pruning step may prompt a user to select one or more compensatory elements for elimination based on a graphical representation of the altered network and parameters associated with the compensatory elements.

Again, generally speaking, and without intending to be limiting, further aspects of the invention relate to systems for physically mitigating an electrical power grid network to accommodate change(s) in facility parameters and/or network topology, and/or additions or retirements of facilities, such systems preferably involving one or more of the following: (a) information receiving software, module(s), logic, and/or storage sufficient to determine topology and facility parameters of the network after the change(s) to facility parameters and/or network topology, and/or additions or retirements of facilities have been applied; (b) storage that indicates an operating state of the original network; (c) software/module(s)/logic configured for determining data errors and/or non-physical configurations from the information received/stored in (a) and (b); (d) software/module(s)/logic configured for applying corrections to the data errors and/or non-physical configurations determined in (c); (e) software/module(s)/logic configured for determining initial responsive adjustment(s) to the altered network using model(s) that tolerate non-physicality; (f) software/module(s)/logic configured for determining final responsive adjustment(s) to the altered network using actual AC power flow optimization; and/or (g) software/module(s)/logic configured for verifying the final responsive adjustment(s) using full AC simulation of the altered network with the final responsive adjustment(s) applied. In some embodiments, the software/module(s)/logic configured for determining data errors in step (c) may comprise one or more of: (i) software/module(s)/logic configured for determining whether a facility parameter is outside of physically reasonable bounds; and/or (ii) software/module(s)/logic configured for determining whether an operating state variable is outside of physically reasonable bounds. In some embodiments, the software/module(s)/logic configured for determining non-physical configurations in step (c) may comprise one or more of: (i) software/module(s)/logic configured for identifying conflicting control parameters; and/or (ii) software/module(s)/logic configured for identifying conflicting transformer settings. In some embodiments, the software/module(s)/logic configured for determining initial responsive adjustment(s) in step (e) may comprise: (i) software/module(s)/logic configured for performing a first-pass optimization, using a model that tolerates non-physicality, to identify portion(s) of the altered network for parameter adjustment and/or deployment of additional facilities; and (ii) software/module(s)/logic configured for performing a second-pass optimization, also using a model that tolerates non-physicality, to refine the identified parameter adjustment(s) and/or newly deployed facilities. In some embodiments, the software/module(s)/logic configured for performing the first-pass optimization may comprise software/module(s)/logic configured for determining first-pass adjustment(s) to existing facilities. In some embodiments, the software/module(s)/logic configured for performing the first-pass optimization may further comprise software/module(s)/logic configured for determining first-pass adjustments to the additionally deployed facilities. In some embodiments, the software/module(s)/logic configured for performing the second-pass optimization may comprise software/module(s)/logic configured for refining the first-pass adjustments(s) to existing facilities. In some embodiments, the software/module(s)/logic configured for performing the second-pass optimization may comprise: (i) software/module(s)/logic configured for refining the first-pass adjustments(s) to existing facilities; and (ii) software/module(s)/logic configured for refining the first-pass adjustments to the additionally deployed facilities. In some embodiments, the systems may further include: (i) software/module(s)/logic configured for instantiating a plurality of idealized compensatory elements at a plurality of points in the altered network; and (ii) software/module(s)/logic configured for determining parameters for the compensatory elements that compensate for non-physicality in the altered network. In some further embodiments, such systems may further include: (iii) software/module(s)/logic configured for performing one or more pruning steps to reduce the number of compensatory elements in the altered network. In some embodiments, such pruning software/module(s)/logic may be configured to eliminate one or more of the compensatory elements from the altered network and adjust the parameters of other compensatory element(s) to maintain physically feasible operating conditions in the altered network. In other embodiments, such pruning software/module(s)/logic may be configured to eliminate one or more of the compensatory elements from the altered network and adjust the parameters of other compensatory element(s) and/or the parameters of existing network facilities to maintain physically feasible operating conditions in the altered network. In some embodiments, such pruning software/module(s)/logic may be configured to select one or more compensatory elements to eliminate based on an automated search process, guided by a cost function. In some embodiments, the cost function may be programmed to cause the search process to favor elimination of compensatory elements that provide the least amount of feasibility compensation in the altered network. In some embodiments, such pruning software/module(s)/logic may be configured to eliminate one or more user-selected compensatory elements. In some embodiments, such pruning software/module(s)/logic may be configured to prompt a user to select one or more compensatory elements for elimination based on a graphical representation of the altered network and costs associated with the compensatory elements. In some embodiments, such pruning software/module(s)/logic may be configured to prompt a user to select one or more compensatory elements for elimination based on a graphical representation of the altered network and parameters associated with the compensatory elements.

BRIEF DESCRIPTION OF THE FIGURES

These, as well as other, objects, features, aspects, and advantages of the present invention are more fully discussed below and exemplified, in part, by the following set of figures, in which.

DETAILED DESCRIPTION OF EXEMPLARY EMBODIMENTS

Figure 1:
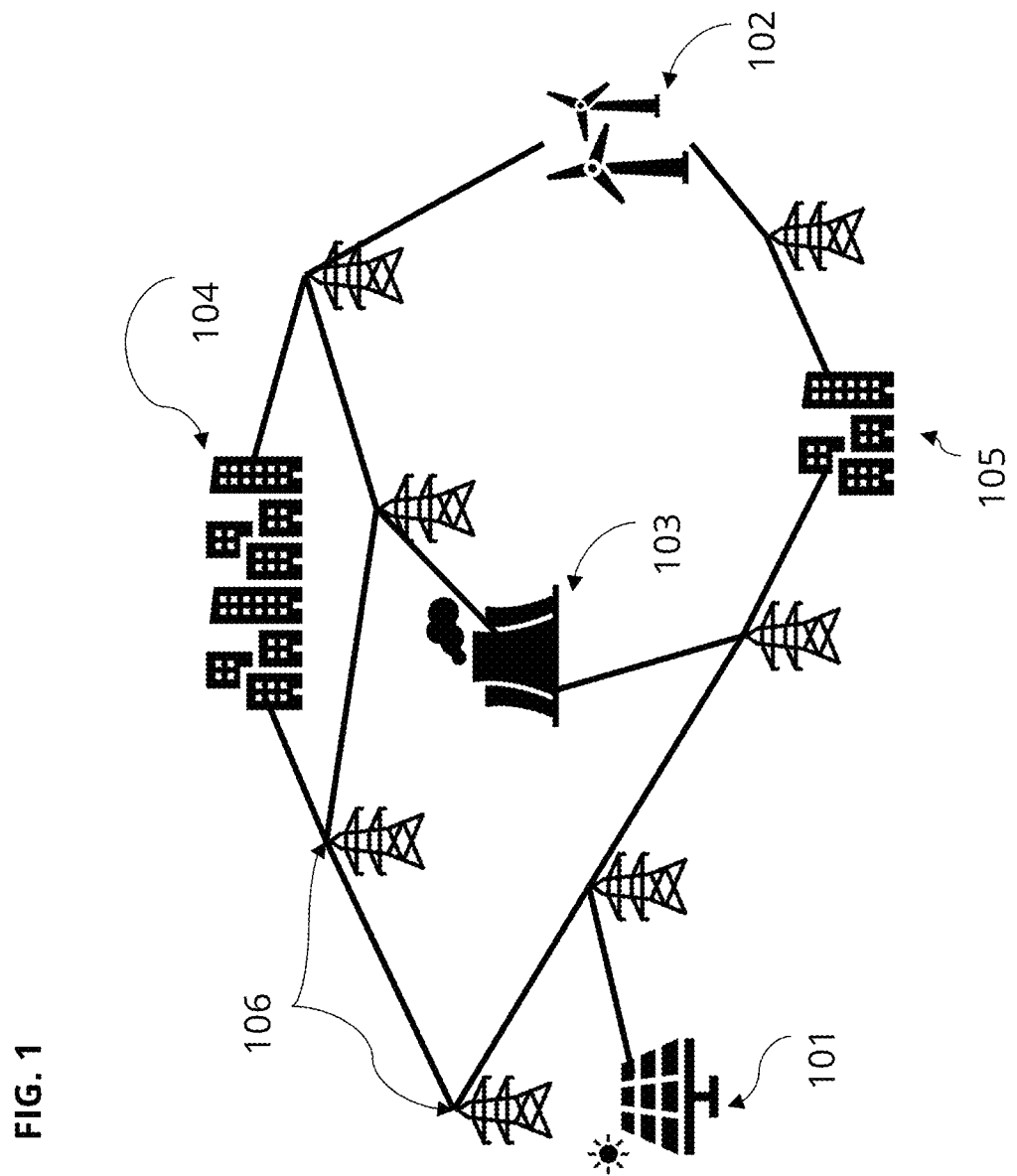
FIG. 1 depicts a simplified representation of an electrical power grid, with electrical generation, electrical load, and transmission paths allowing power to flow.

Reference is now made to FIG. 1, containing a simplified illustration of an electrical power grid. Electrical generation plants, such as solar (101), wind (102), and conventional coal/natural gas/nuclear (103), generate power to serve electrical loads (104, 105). Power flows through transmission paths (106) that connect the generation sources to the loads. In a typical electrical power grid, there are more facilities that may be present, including transformers, capacitor and inductor banks, high voltage DC transmission lines, and more. Large-scale solar, wind, and conventional generation are typically not directly connected to the loads.

Figure 2:
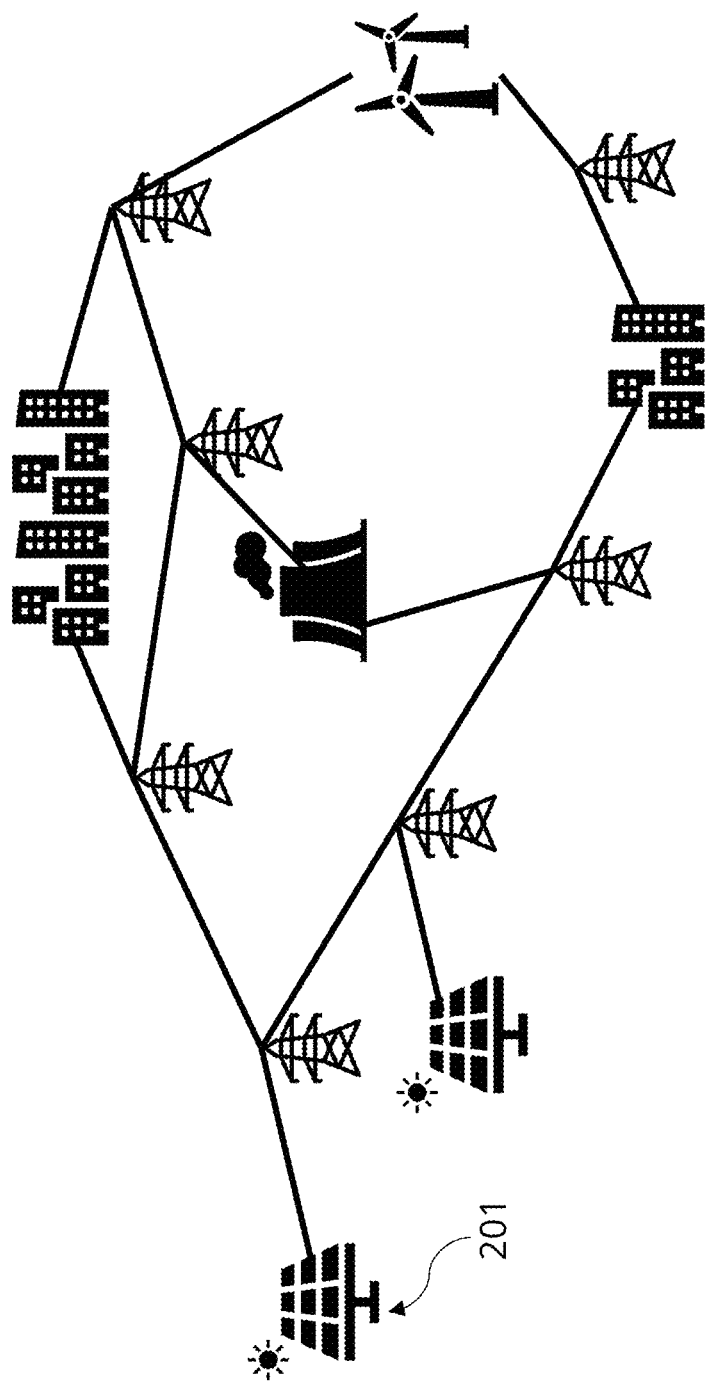
FIG. 2 depicts an illustration of a proposed interconnection of a new solar generation plant.

Reference is now made to FIG. 2, which illustrates a new solar generation plant (201) being interconnected to the grid. It is common to use simulation to assess the effect of connecting a new generation project to the grid, particularly its impact on grid reliability. These simulations are at the core of the interconnection study process, and determine the mitigations required to allow the new generator to be safely interconnected to the grid. In the context of an interconnection study, mitigations may involve construction of new facilities (e.g., a new transmission line such as that depicted by 302 in FIG. 3) or adjustment of existing facilities (e.g., reducing the generation output of existing generation, such as that depicted by 301 in FIG. 3). The mitigations required to support a new interconnection have a substantial impact on the viability of a project, as construction of new transmission facilities may add tens to hundreds of millions of dollars in costs. It is not uncommon for proposed projects to be abandoned if the cost of mitigations is high.

The specific interconnection study process and rules on cost allocations vary from regional entity to regional entity. Because of the cost and effort involved, interconnection studies often involve grouping together a plurality of proposed projects in similar geographic regions with similar prospective in-service dates, and then identifying the required mitigations to support the entire "cluster." However, the process described in the preceding paragraph can be generalized as:

1. Apply one or more changes to a stable electrical power grid in a simulation model;
2. Assess the impacts on overall grid reliability conditions (e.g., thermal overloads, low system voltages, etc.);
3. Determine a set of mitigations that resolves any issues identified in the preceding step.

Figure 3:
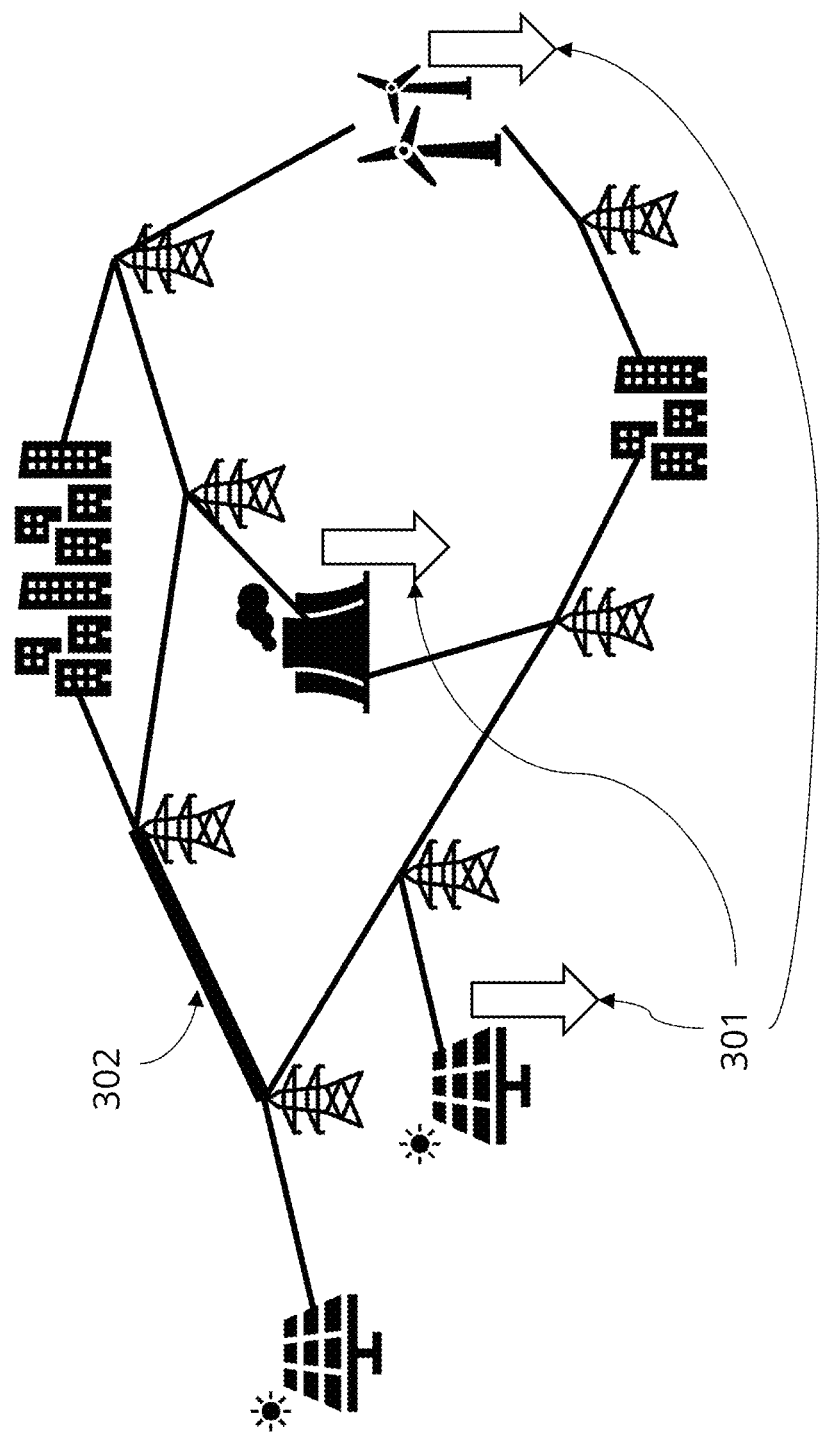
FIG. 3 illustrates potential mitigations to safely interconnect the new solar plant.
Figure 4:
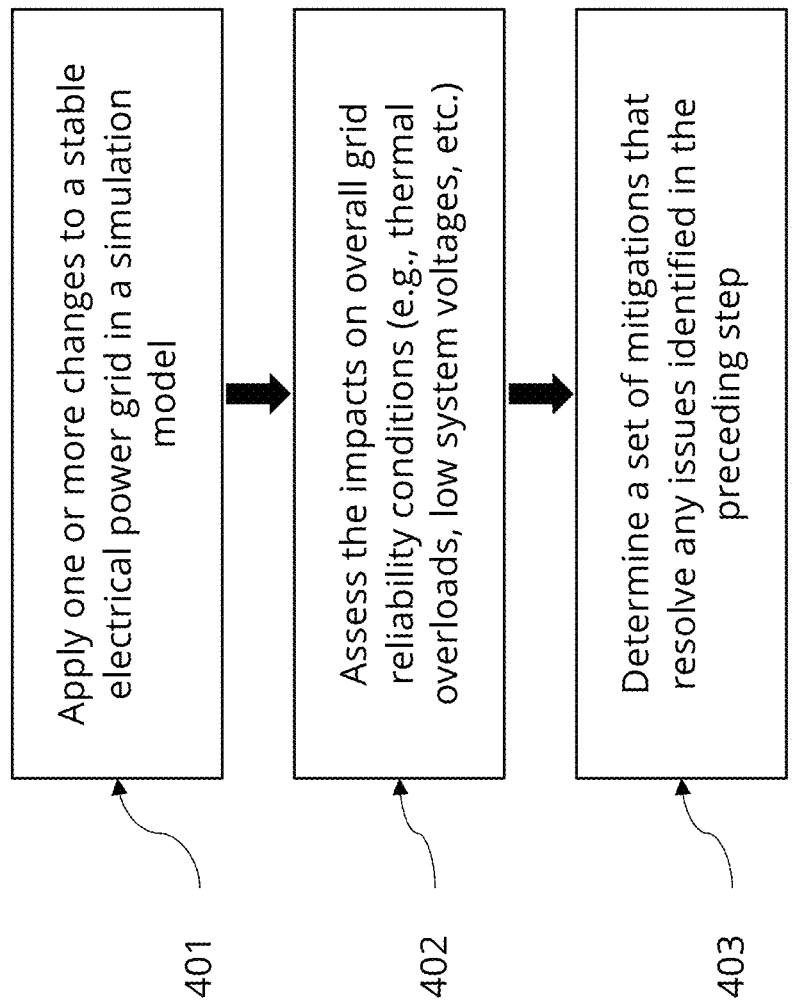
FIG. 4 contains a high-level block diagram representing a traditional process of identifying mitigations to resolve grid reliability issues that stem from changes being applied to a previously stable system.

This process is shown as a block diagram in FIG. 4. FIG. 2 is a depiction of step 401, wherein the "change" is the proposed interconnection of a new solar generation plant. The interconnection study process, involving a multitude of physical simulations of the electrical power grid with the new generator connected, is step 402. FIG. 3 is a depiction of step 403, wherein the mitigations are reduction of existing generation (301) and upgrading an existing transmission path to support a higher flow of power (302).

Figure 5:
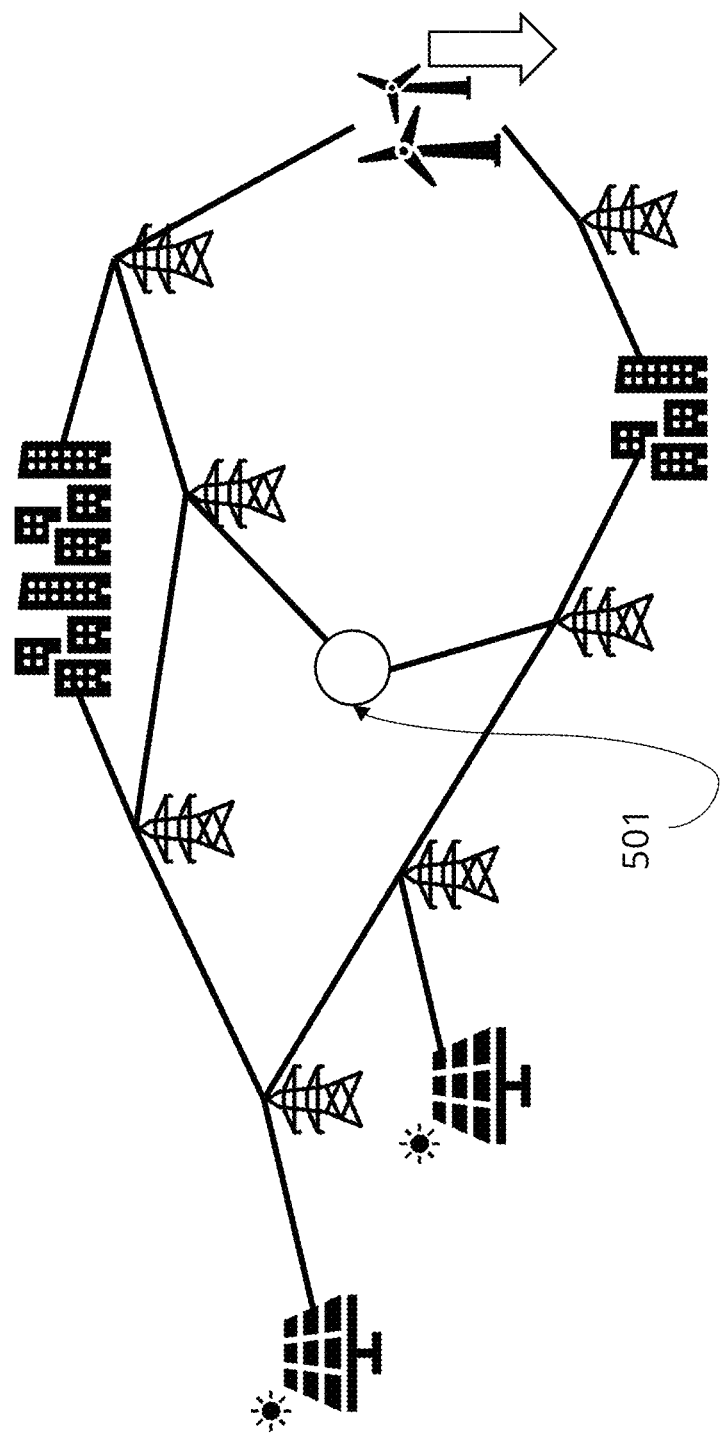
FIG. 5 illustrates the retirement of an existing generation plant.
Figure 6:
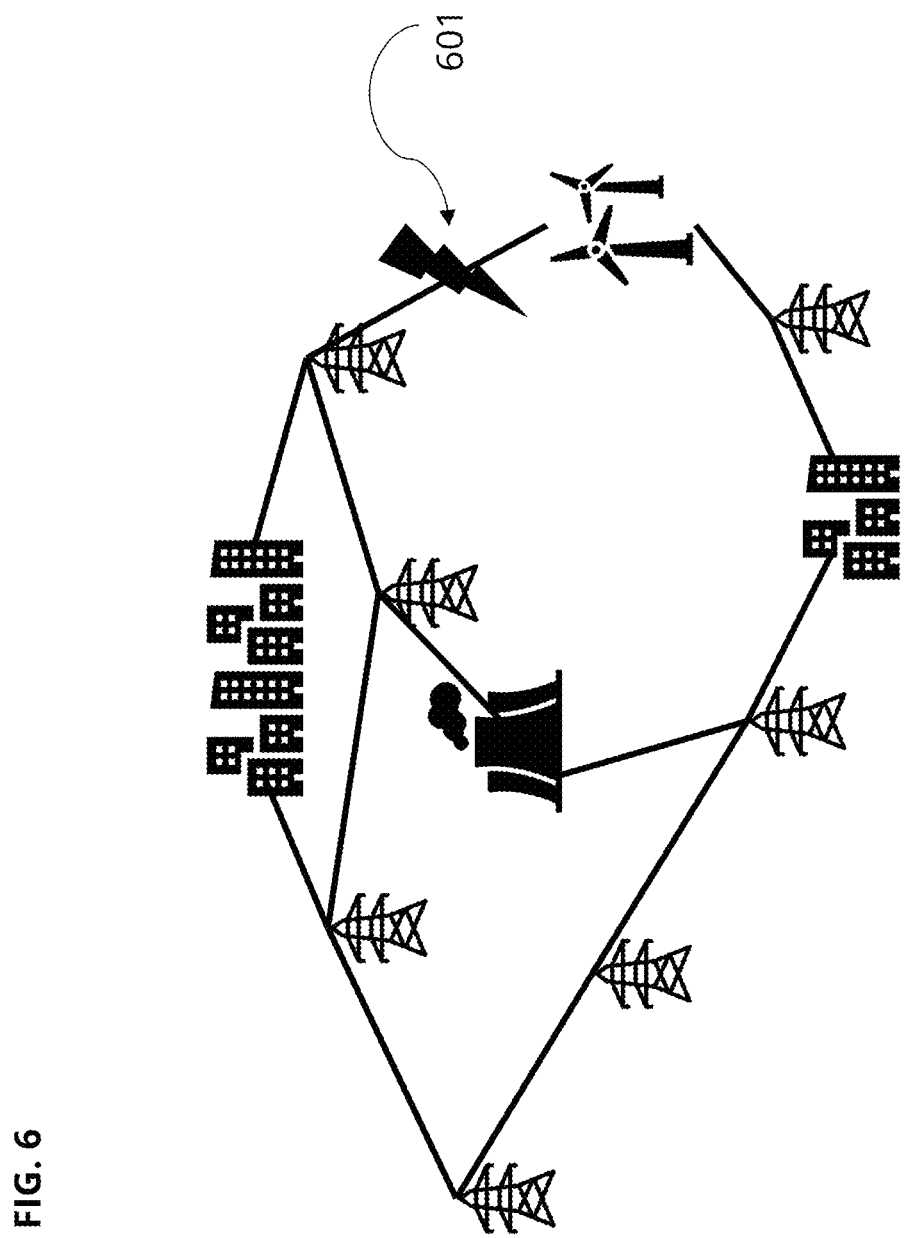
FIG. 6 contains a depiction of the electrical power grid with a transmission line under outage conditions.

FIG. 4 represents many applications in electrical power grid planning and operations. Consider FIG. 5, which illustrates the retirement (disconnection) of electrical generation plant 501. Studying the impact of plant retirements is a crucial process performed by electric utilities and electric grid operators, as the loss of a plant may lead to grid reliability issues that include low system voltages and/or a lack of generation capacity (e.g., not enough power and/or reserve power to serve the loads). Mitigations to correct these issues may include redispatch (increasing the power generation of other facilities) and/or installation of voltage-regulating equipment. FIG. 6 is another common example, wherein an electric grid operator may wish to determine the impact of and mitigation solutions for the loss of one or more on-line facilities (e.g., the transmission path of 601).

Figure 7:
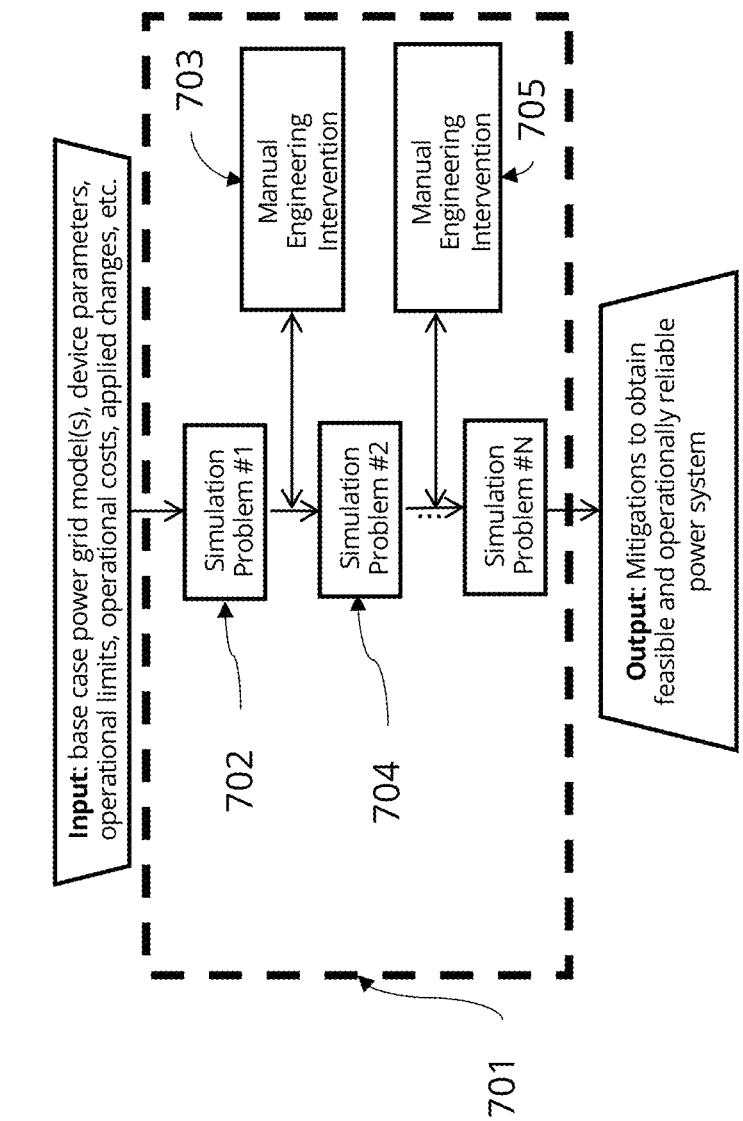
FIG. 7 contains a block diagram representing the sequence of steps an experienced power systems engineer would traditionally take to identify mitigations that resolve power grid reliability issues.

Reference is now made to FIG. 7, a block diagram representing the standard state-of-the-art system to conduct the process of FIG. 4. The system (701) takes as input one or more "base case" power grid simulation models, including connectivity/topology information, facility parameters and settings, operational limits, operational costs, and a set of changes to apply or already pre-applied to the model(s). After application of the changes, the system begins with a simulation problem (702) that simulates the electrical physics of the grid with the changes applied. When the simulation concludes—successfully or unsuccessfully—a manual intervention step (703) proceeds wherein a user observes the simulation output and applies one or more mitigation solutions they believe will resolve any reliability issues. A new simulation problem is then conducted (704), and the results checked again for application of potential mitigation solutions (705). This "guess" (a user applies a custom or pre-defined mitigation solution in response to a simulation output) and "check" (a simulation is conducted to determine if the mitigations resolved the issues motivating mitigations) procedure is repeated until no further reliability issues remain, or until further progress appears futile. The output of the system is the set of mitigations required to obtain a feasible and operationally reliable electrical power grid, and may also include a solved model representing that system state. The mitigations may indicate new control settings for the electrical power grid which an operator may apply (e.g., adjustment of generation or reactive power support devices), or new facilities to construct in the context of a long-term planning study.

The state-of-the-art system of FIG. 7 has a number of limitations that are well known to practitioners in the field. Depending on the number and complexity of changes being applied to the base case power grid model, it may take hours, days, weeks, or even months for engineers to run the "guess and check" method to completion. In interconnection studies, for example, engineers are typically applying the changes (proposed interconnections of new generation) across a plurality of base case models, each representing the grid at a fixed time point in a different season and/or future year. The method of FIG. 7 is therefore run for each model, with the final set of mitigations determined only after mitigating each individual base case. The entire process has been shown to take months in a number of interconnection study cycles across the United States. Moreover, the types and sizes of mitigation solutions are often based on engineering judgement. In some cases, this can lead to mitigations that are over-sized, suboptimally-placed, or not strictly required to resolve the underlying issues. As a consequence, the cost of implementing these mitigation solutions may be prohibitively high, or in the context of operational applications, they may limit the flexibility and resilience of the grid.

Figure 8:
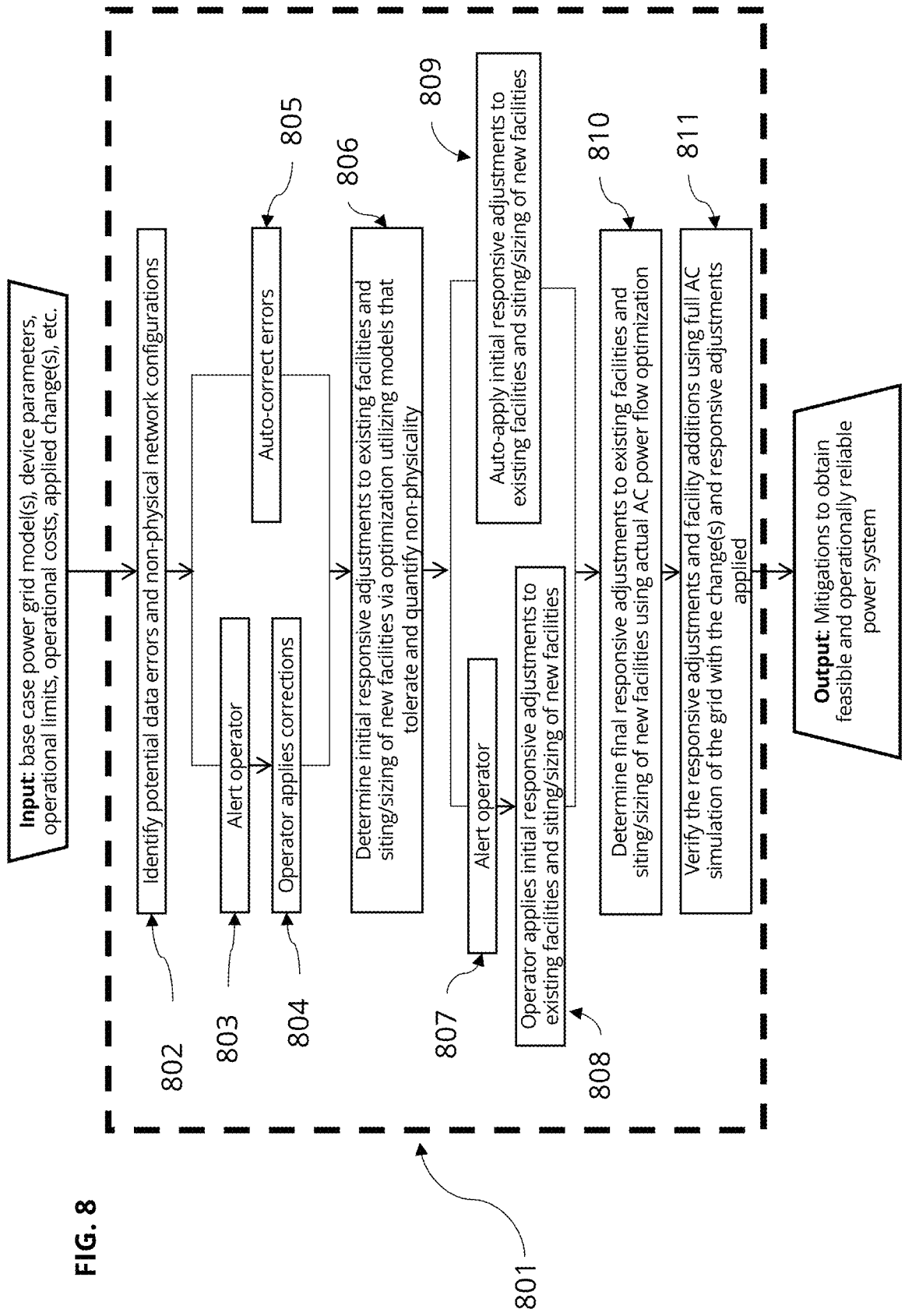
FIG. 8 contains a high-level block diagram of the inventive system/method, highlighting the individual processes performed to identify physical mitigations for application to the electrical power grid.

Reference is now made to FIG. 8, a high-level block diagram of an exemplary embodiment of the inventive approach. Inputs and outputs are the same as that of FIG. 7, but the embodiment itself (801) preferably employs the following steps:

802: perform a series of data quality checks to identify errors and/or non-physical configurations in the power grid model;

803/804 or 805: upon identification of any data errors or non-physical configurations, alert an operator for manual application of corrections OR auto-correct the issues using pre-programmed responsive logic;

806: determine initial responsive adjustments to existing facilities in the power grid and place and size new facilities utilizing device models that tolerate non-physicality;

807: determine final responsive adjustments to existing facilities in the power grid and placement/sizing of new facilities utilizing device models that represent the actual steady state AC physics of the system (i.e., models that do not tolerate non-physicality);

808: verify the final responsive adjustments to existing facilities in the power grid and placement/sizing of new facilities while preserving the physicality of the results.

The embodiment preferably runs reliably without manual engineering intervention between any two subsequent steps (with the possible exception of 803/804), providing automation capabilities that drastically reduce analysis time. By utilizing models that tolerate non-physicality in step 806, the initial infeasibility that leads to unreliability and poor convergence in the "guess and check" system of FIG. 7 is identified and minimized automatically.

Figure 9:
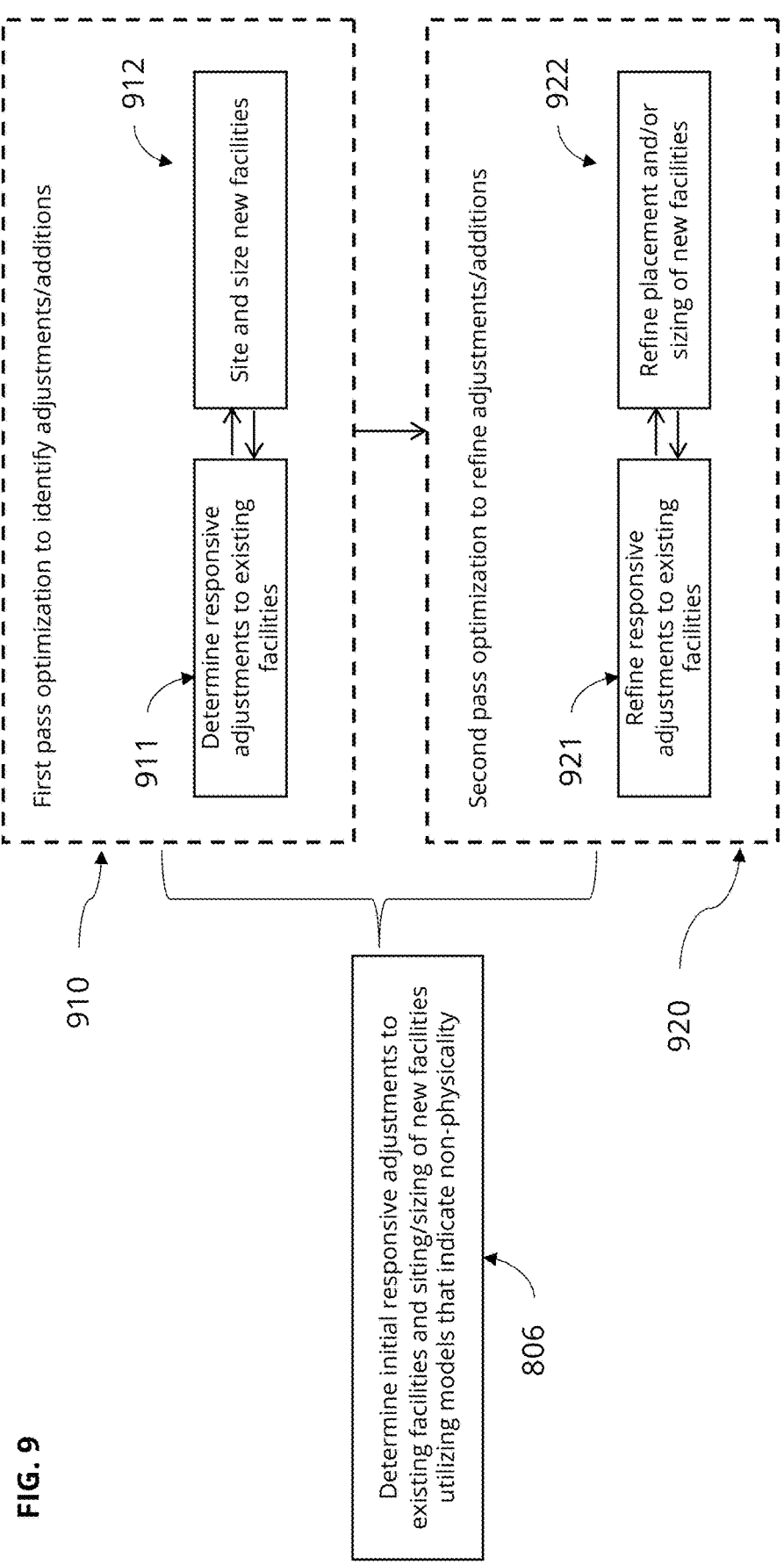
FIG. 9 contains a block diagram expanding one process of the inventive system/method, wherein first and/or second pass optimization processes may be used to determine initial responsive adjustments and/or additions of new facilities in response to a change in the electrical power grid.

Reference is now made to FIG. 9, a block diagram that expands upon step 806 of FIG. 8. Two steps comprise determining the initial responsive adjustments. 910, a "first-pass optimization" applies a broad range of changes to existing facilities (911) and/or places new facilities (912) throughout the electrical power grid. This is followed by 920, a "second-pass" optimization that refines these changes and/or additions. Refinement may include narrowing the amount and/or magnitude of changes to a tighter margin (921), and/or removing a subset of the facilities added in 910 (922).

Figure 10:
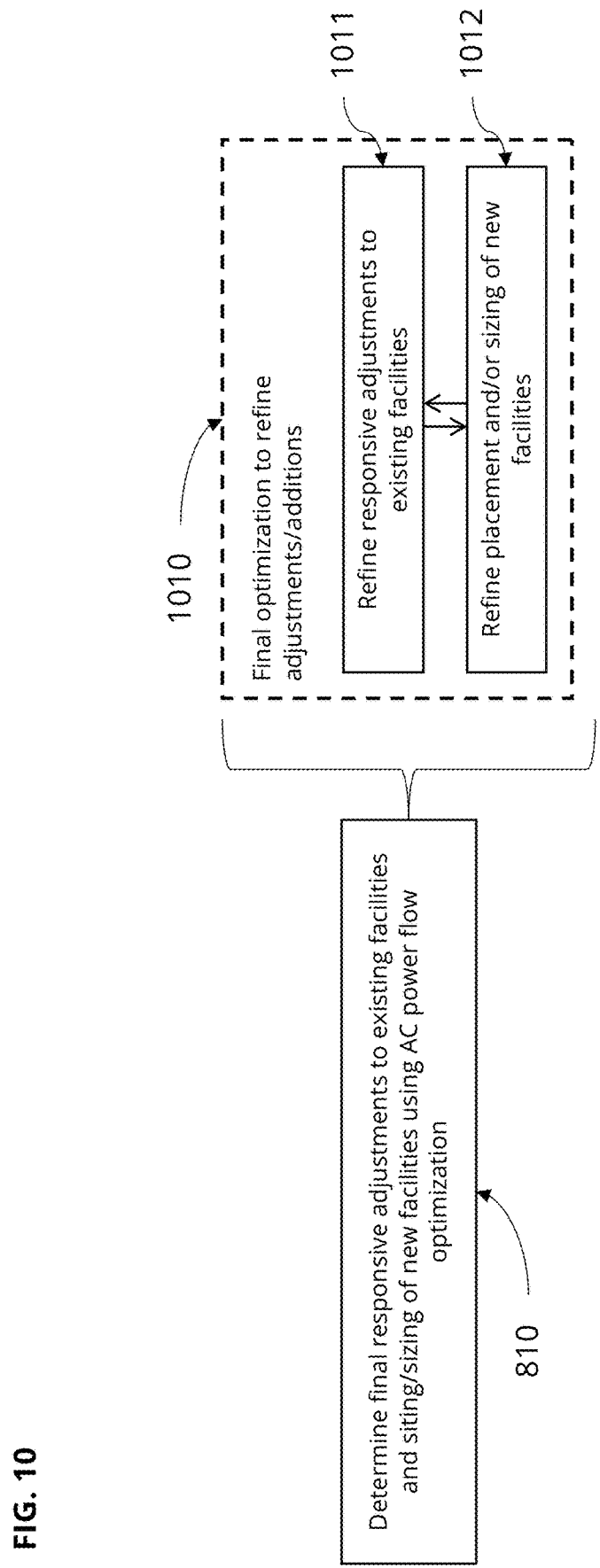
FIG. 10 contains a block diagram expanding one process of the inventive system/method, wherein first and/or second pass optimization processes may be used to determine final responsive adjustments and/or additions of new facilities in response to a change in the electrical power grid.

Reference is now made to FIG. 10, a block diagram that expands upon step 807 of FIG. 8. A final optimization to further refine the responsive adjustments (1011) and/or facility additions (1012) comprises this step (1010). Unlike the optimization passes of FIG. 9, which are based on underlying models that tolerate deviations from the true physics of the electrical power grid, 1010 utilizes models that represent the actual steady state AC behavior of the grid components (i.e., models that do not tolerate non-physicality).

Figure 11:
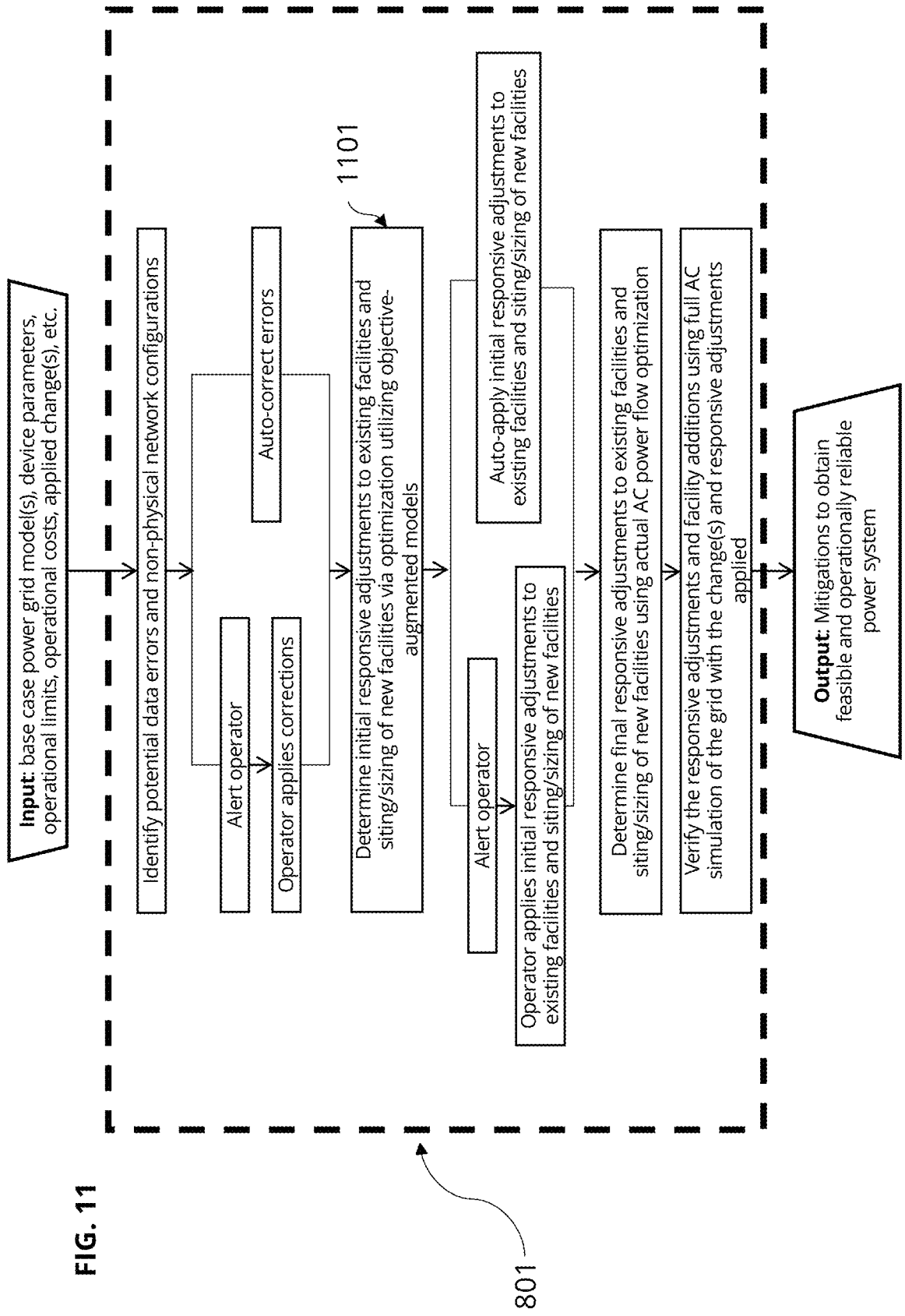
FIG. 11 contains an embodiment of the inventive system/method that utilizes the inventive model relaxation technology.

Reference is now made to FIG. 11, a block diagram of the inventive system (801) with specific reference to the inventive relaxation technology as an example that enables step 1101.

In order to fully enable persons of skill in the art to make and use the full scope of the invention for its intended technological applications in power grid planning and management, we will now outline the theoretical optimization principles on which the preferred embodiments are based. It should be understood, however, that the intent here is to enable the practical application of this invention as claimed, not to in any way claim as our invention the mathematical principles or abstractions on which the invention's improved performance and reliability is/are based.

Figure 12:
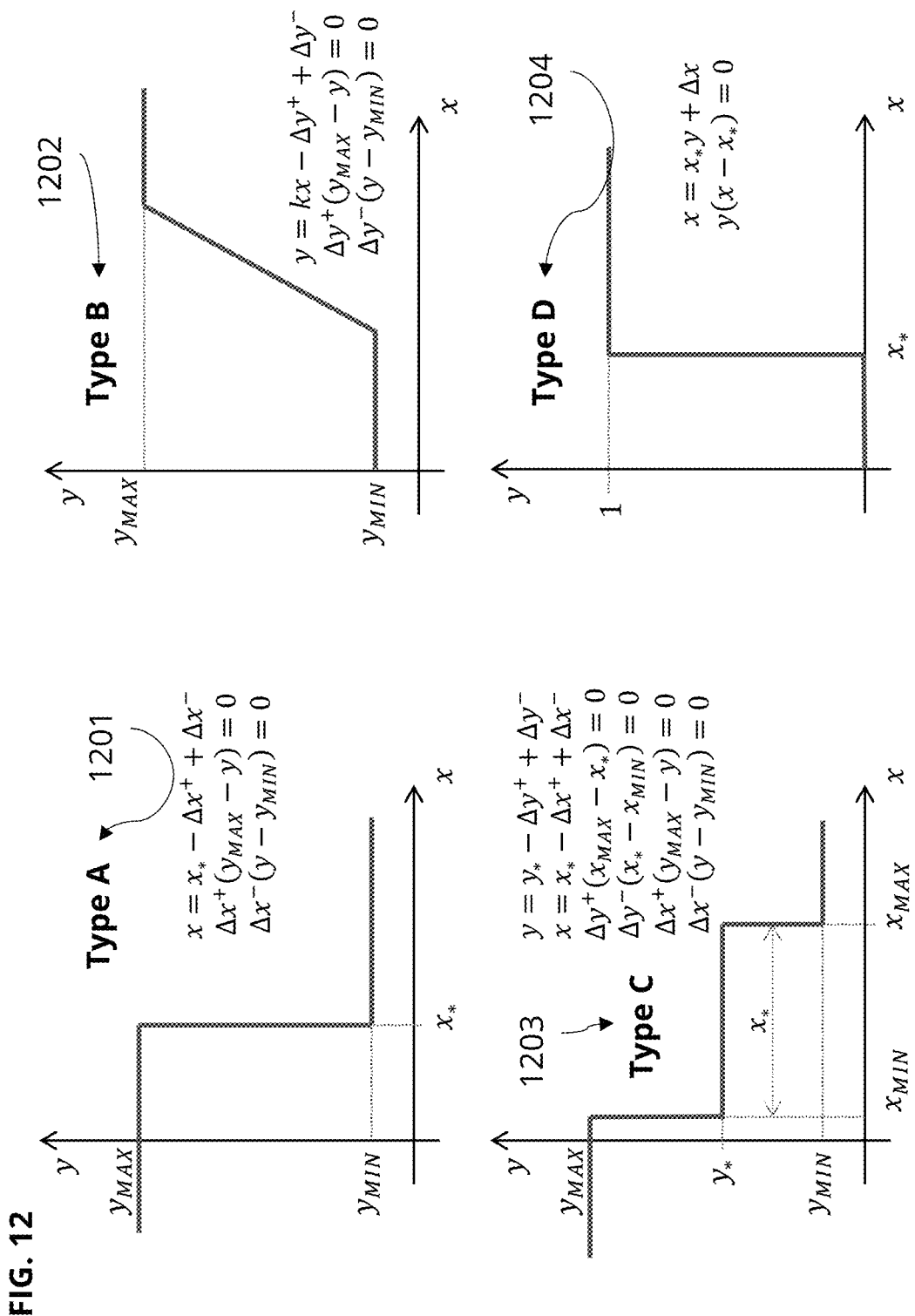
FIG. 12 contains graphical and mathematical representations of the four types of models of physical control characteristics that are found in steady-state simulation and optimization of AC power grids.

The general problem of optimizing an electrical power grid—i.e., forming a solution to a stated objective while satisfying various constraints—is complicated by the fact that many elements of an electrical power grid are best represented with conditional ("integer") physical behavior. For example, a transmission line may either be on-line (physically closed) or off-line (physically open), but it cannot be at any other state in between. Various reactive support devices such as capacitor banks operate in discrete states, where the output of the device (e.g., a susceptance) is shifted to a new, physically discrete level if a monitored quantity (e.g., a voltage at some point in the system) falls outside of a desired range. Reference is now made to FIG. 12, which graphically depicts four broad categories of conditional physical behavior in electrical power grid models. Below, we give practical examples of where each model may occur in representing actual power grid physical behavior:

1201: Type A models (point regulation)

Generators, certain types of Flexible AC Transmission (FACTS) devices, synchronous condensers, and static VAR compensators (SVCs) maintain the voltage of a given point in the grid to a pre-defined set point ($x_*$) until their reactive power capacity (y) is reached ($y_{MAX}$ or $y_{MIN}$), in which case the voltage regulation is disabled.

1202: Type B models (participation factor)

Real power output of a generator (y) can be enforced to participate in ramping up/down its power generation based on a pre-specified participation factor (k), such that the total power generation in an area (x) can meet the given demand. This is a function known as Automatic Generation Control (AGC). If the generator approaches its real power capacity limit, the AGC participation is disabled, and the generator can no longer participate in supplying additional real power.

An electrical system bus in the power grid may have its voltage regulated by a collection of facilities, including generators, FACTS devices, and SVCs (collectively referred to as a "plant"). In this case, the reactive power amount (x) needed to maintain the voltage at a specified operating point is distributed within the plant's participating devices based on pre-specified participation factors (k), until the reactive power capacity (y) of each of the participating devices is approached. In this case, a plant participating device no longer participates in voltage regulation due to its capacity requirements.

1203: Type C models (band control)

A discrete switched shunt device remains at an initial position ($y_*$) until a monitored quantity (such as a system voltage) approaches its upper/lower band limits ($x_{MAX}$ and $x_{MIN}$). When the voltage approaches a pre-specified limit, the shunt is allowed to change its position to maintain the regulated quantity within the band. If, however, it happens that the shunt device reaches its operational capacity limits ($y_{MAX}$ and $y_{MIN}$), the monitored quantity cannot be maintained within the pre-specified band and the regulation behavior is disabled.

Similar to the switched shunt operation defined above, certain types of transformers also exhibit band control behavior. In these devices, transformer tap positions or phase shift angles are adjusted to maintain a regulated quantity (e.g., voltage, power flow) within an allowable band defined by minimum and maximum values.

1204: Type D models (on/off switch)

One of the most common actions in physical power flow optimization problems is modeling the switching of (on/off) of a generator. For example, if it happens that the operation of a generator becomes too expensive with consideration of all operational, economic, and environmental limits, it may be switched off within the optimization problem. In terms of the characteristics shown in 1204 of FIG. 10, and with the assumption that expensive generators will operate at their respective lower capacity limits ($x_*$), we can define the switch as a conditional integer (y) that will turn off if the generator operates at its lower operational limit.

In emergency situations, a power grid operator may choose to shed load (i.e., disconnect service to some loads) in order to avoid a full-scale blackout. If a monitored voltage or frequency reaches a point that triggers a load shedding mechanism ($x_*$), a switch can turn off pre-specified blocks of demand in such a way to maintain feasible power system operation.

Another condition best represented as an on/off switch is the opening/closing of a branch element (transmission line or transformer) to relieve network congestion.

It is the difficulty in incorporating the behavior of the physical models in FIG. 12 within an optimization problem that makes 806 and 807 of FIG. 8 prohibitively difficult with state-of-the-art methods. Each represents steep conditional characteristics that are not differentiable on the whole domain, and hence cannot be directly incorporated within continuous-based approaches for solving nonlinear systems. Existing "state-of-the-art" toolboxes used for power flow simulation and optimization apply a fixed-point iteration approach implemented as an outer loop around the core power flow solver to switch between discrete modeling segments. This, however, represents a cause of potential severe convergence issues that include convergence to unstable (nonphysical) power flow solutions, simulation divergence, or prolonged convergence due to variable oscillations that can appear. Mixed-integer and complementarity-based models are still at an academic research level and are mostly not practical for solving realistic power grid models within state-of-the-art tools.

The characteristics of the four types of conditional variables in FIG. 12 can be defined in terms of conditional complementarity characteristics, which therefore allows the application of the inventive approach for handling them in a continuous way in terms of objective function augmentations implemented within an optimization environment. For instance, an example of utilizing the objective function augmentations for incorporating the four characteristic types are presented in (4)-(7) below.

Non-Physicality Tolerable Modeling Representation of Type A Characteristics:

$$\min_{y,\Delta x^+,\Delta x^-} w_{xp,2}[\Delta x^+]^2 + w_{xp,1}\Delta x^+ + \qquad (4)$$

$$w_p(y_{MAX} - y)^2 + w_{xn,2}[\Delta x^-]^2 + w_{xn,1}\Delta x^- + w_n(y - y_{MIN})^2$$

$$x = x_* - \Delta x^+ + \Delta x^-$$

$$y_{MIN} \le y \le y_{MAX}$$

$$\Delta x^+, \Delta x^- \ge 0$$

Non-Physicality Tolerable Modeling Representation of Type B Characteristics:

$$\min_{y,\Delta x^+,\Delta x^-} w_{xp,2}[\Delta x^+]^2 + w_{xp,1}\Delta x^+ + \qquad (5)$$

$$w_p(y_{MAX} - y)^2 + w_{xn,2}[\Delta x^-]^2 + w_{xn,1}\Delta x^- + w_n(y - y_{MIN})^2$$

$$x = ky - \Delta x^+ + \Delta x^-$$

$$y_{MIN} \le y \le y_{MAX}$$

$$\Delta x^+, \Delta x^- \ge 0$$

Non-Physicality Tolerable Modeling Representation of Type C Characteristics:

$$\min_{x,y,\Delta x^+,\Delta x^-,\Delta y^+,\Delta y^-} w_{xp,2}[\Delta x^+]^2 + w_{xp,1}\Delta x^+ + w_{xn,2}[\Delta x^-]^2 + \qquad (6)$$

$$w_{xn,1}\Delta x^- + w_{yp,2}[\Delta y^+]^2 + w_{yp,q}\Delta y^+ + w_{yn,2}[\Delta y^-]^2 + w_{yn,1}\Delta y^- +$$

$$w_{xp}(y_{MAX} - y)^2 + w_{xn}(y - y_{MIN})^2 + w_{yp}(x_{MAX} - x_*)^2 + w_{yn}(x_* - x_{MIN})^2$$

$$x = x_* - \Delta x^+ + \Delta x^-$$

$$y = y_* - \Delta y^+ + \Delta y^-$$

$$x_{MIN} \le x_* \le x_{MAX}$$

$$y_{MIN} \le y \le y_{MAX}$$

$$\Delta x^+, \Delta x^-, \Delta y^+, \Delta y^- \ge 0$$

Non-Physicality Tolerable Modeling Representation of Type D Characteristics:

$$\min_{x,y} w_{y,2}[\Delta y]^2 + w_{y,1}\Delta y + w_{sw}(x - x_*)^2 \qquad (7)$$

$$x = x_* y + \Delta x$$

$$0 \le y \le 1$$

Figure 13:
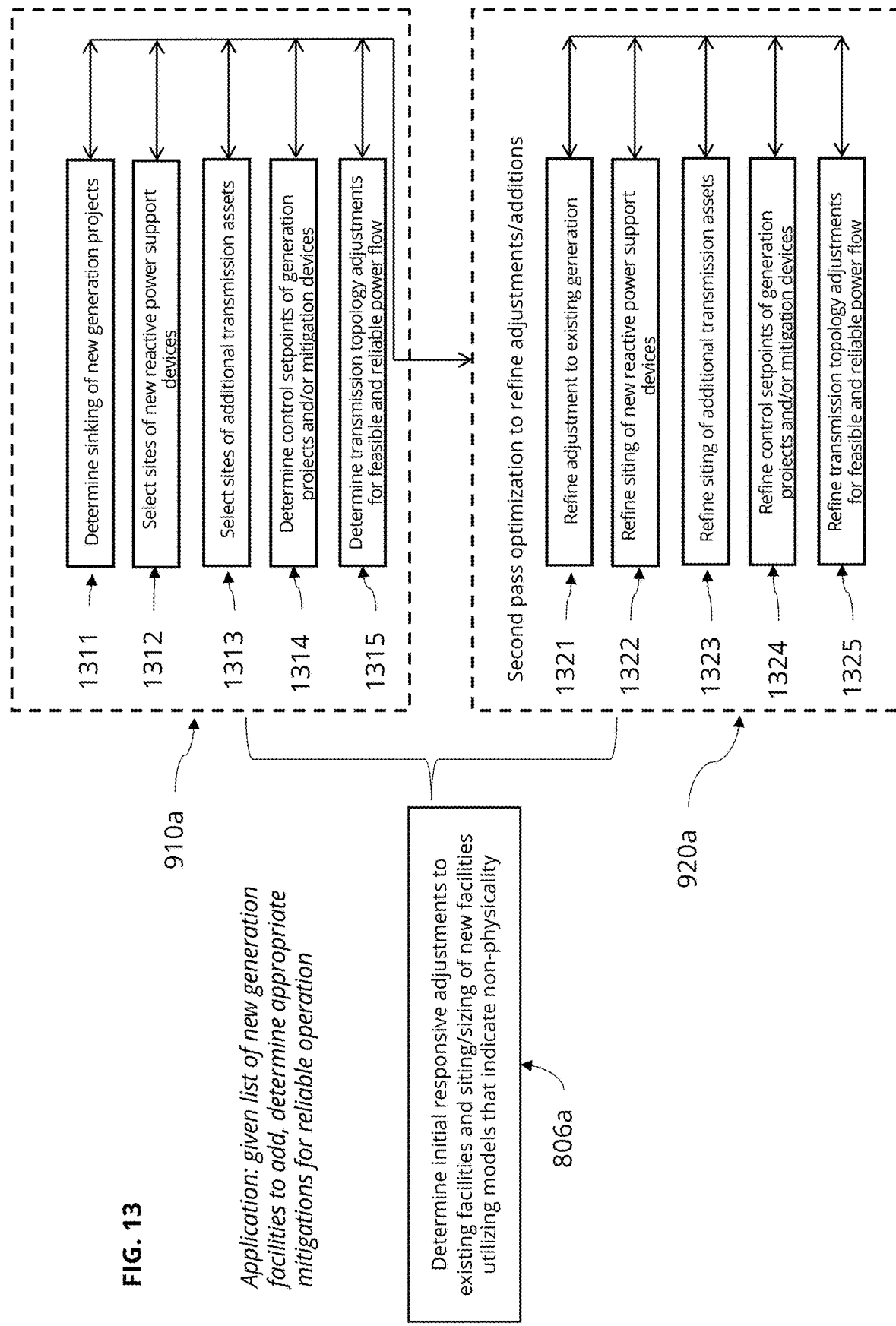
FIG. 13 contains a block diagram expanding the inventive process/system to determine initial responsive adjustments and/or additions of new facilities in response to new generation facilities being interconnected to the grid.

Reference is now made to FIG. 13, which depicts aspects of a preferred process (806a) for determining initial responsive adjustments to existing facilities and/or siting/sizing of new facilities using models that tolerate non-physicality, for the purpose of facilitating the interconnection of new power generation facilities. Process (806a) preferably comprises a first pass phase (910a) and a second pass phase (920a), but both may be combined, or either may be omitted in certain embodiments of the invention.

Beginning with an example of process 910a, such first pass optimization preferably functions primarily to identify adjustments and/or additions to (or, in some cases, removal from) the power grid network and/or components thereof. In certain embodiments, process 910a may include one or more of:

determining (1311) the sinking of new generation projects;
selecting (1312) sites of new reactive power support devices;
selecting (1313) sites of additional transmission assets;
determining (1314) control set points of generation projects and/or mitigation devices;
determining (1315) transmission topology adjustments for feasible and reliable power flow.

For example, and without intending to be limiting, exemplary embodiments of process 910a might include:
subprocess 1311 and subprocess 1314 only;
subprocess 1312 and subprocess 1314 only;
subprocess 1313 and subprocess 1315 only;
subprocess 1312 and subprocess 1315 only.

In particular embodiments, any of subprocesses 1311-1315 may be configured or practiced as manual processes, semi-automated, computer-assisted processes, or fully automated, computer-implemented processes. In the case of semi-automated processes, such processes preferably involve use of graphical computer interfaces, in combination with selection devices, such as mice, pens, or touchscreens, to allow selection and/or parameterization of alternatives presented by the interface, in preferred embodiments, at least one of subprocesses 1311-1315 utilize such preferred form of semi-automated implementation.

Also depicted in FIG. 13 is an exemplary second pass process (920a) that functions principally to refine the adjustments and/or additions resulting from first pass 910. In certain embodiments, exemplary process 920a may include one or more of:

refining (1321) adjustments to existing generation;
refining (1322) siting of new reactive power support devices;
refining (1323) siting of additional transmission assets;
refining (1324) control setpoints of generation projects and/or mitigation devices;
refining (1325) transmission topology adjustments for feasible and reliable power flow.

In certain embodiments of process 920a, refining subprocesses 1322-1323 may involve pruning or removing certain facilities added in previous step(s). In one example, such pruning may comprise an automated process of removing redundant mitigation devices that were added through automated, computer-implemented previous mitigation step(s), such as 1311, 1312, and/or 1313. In certain embodiments, such automated (or semi-automated) pruning is further applied in accordance with and consideration of the capital and operating costs of newly added devices, based on one or more of the following approaches:

1. Brute-force pruning: Each of the newly added mitigation devices may be pruned, one-by-one, while maintaining the operational constraints on the power system response, and while considering the minimization of capital and operating costs.
2. Sensitivity-based pruning: The newly added mitigation devices are pruned in batches or one-by-one, while considering the sensitivity to the perturbation of the power system response following the removal of such device candidates.
3. Utilizing MINLP algorithms such as Genetic Programming: Formulate the pruning as an optimization problem with the objective of minimizing the capital and operating costs of the newly added mitigation devices, while preserving power system operability and stability.

Finally, preferred embodiments also utilize a non-physicality tolerable model approach. Table 1 contains sample results of the exemplary processes of FIG. 13 in siting new reactive support facilities across three unique scenarios of proposed interconnections of new generation.

TABLE 1

Number of new reactive facilities identified by the exemplary system of FIG. 13 in response to large amounts of new generation in various scenarios.

| Scenario | Amount of Generation Added | Reactive Facilities Added to Achieve Feasibility |
| --- | --- | --- |
| 2023 Summer Peak Loading | 2.4 GW | 0 |
| 2026 Winter Peak Loading | 6 GW | 4 |
| 2026 Summer Peak Loading | 4.2 GW | 1 |

Figure 14:
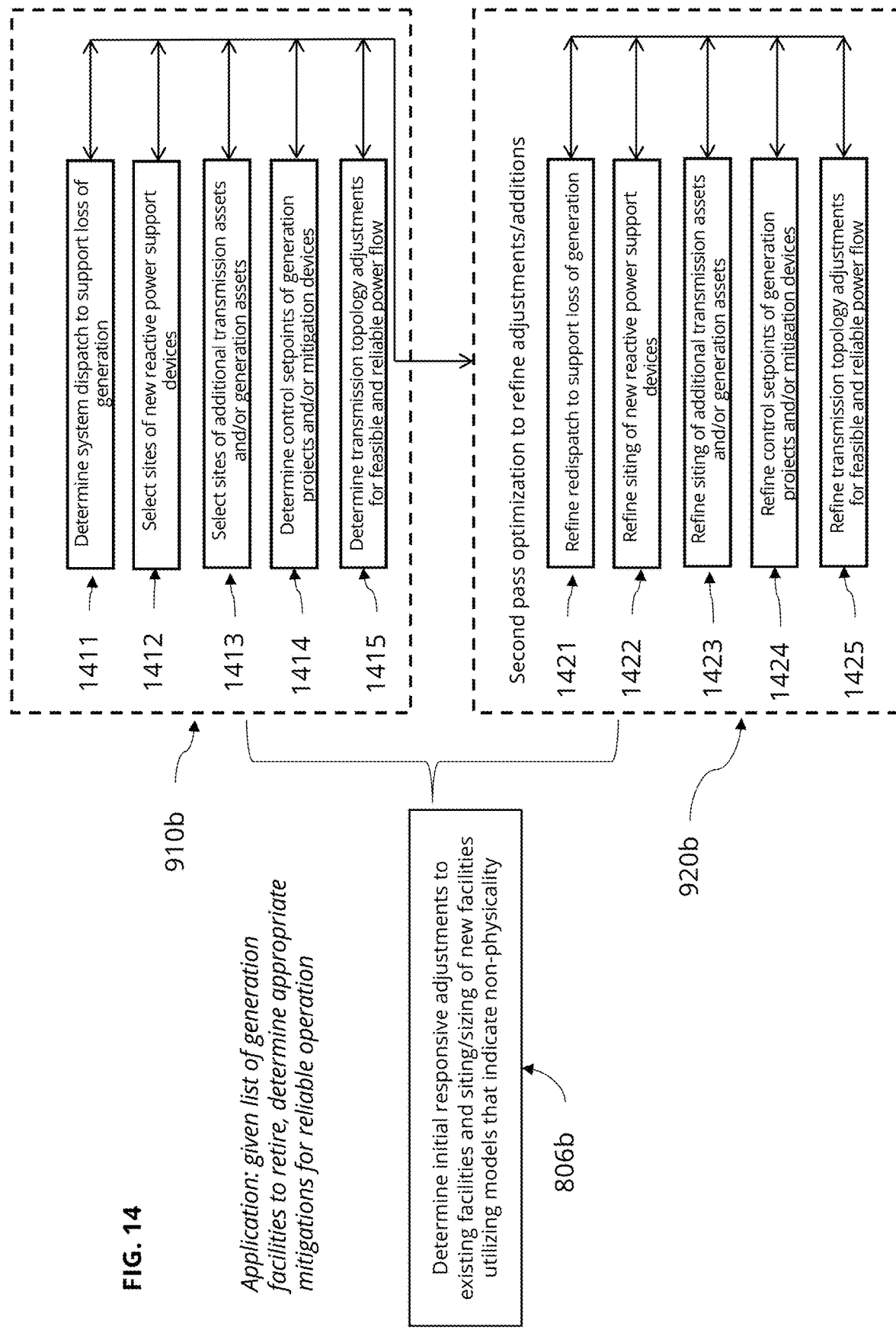
FIG. 14 contains a block diagram expanding the inventive process/system to determine initial responsive adjustments and/or additions of new facilities in response to aging generation facilities being disconnected from the grid.

Reference is now made to FIG. 14, which depicts aspects of a preferred system/process (806b) for determining initial responsive adjustments to existing facilities and/or siting/sizing of new facilities using models that tolerate non-physicality, for the purpose of facilitating the retirement of aging power generation facilities. Process (806b) preferably comprises a first pass phase (910b) and a second pass phase (920b), but both may be combined, or either may be omitted in certain embodiments of the invention.

Beginning with an example of process 910b, such first pass optimization preferably functions primarily to identify adjustments and/or additions to (or, in some cases, removal from) the power grid network and/or components thereof. In certain embodiments, process 910b may include one or more of:

determining (1411) the real power dispatch setpoints of other system generators to support the loss of the retired units;
selecting (1412) sites of new reactive power support devices;
selecting (1413) sites of additional transmission assets and/or additional generation assets;
determining (1414) control set points of generation projects and/or mitigation devices;
determining (1415) transmission topology adjustments for feasible and reliable power flow.

For example, and without intending to be limiting, exemplary embodiments of process 910b might include:
subprocess 1411 and subprocess 1414 only;
subprocess 1412 and subprocess 1414 only;
subprocess 1413 and subprocess 1415 only;
subprocess 1412 and subprocess 1415 only.

In particular embodiments, any of subprocesses 1411-1415 may be configured or practiced as manual processes, semi-automated, computer-assisted processes, or fully automated, computer-implemented processes. In the case of semi-automated processes, such processes preferably involve use of graphical computer interfaces, in combination with selection devices, such as mice, pens, or touchscreens, to allow selection and/or parameterization of alternatives presented by the interface, in preferred embodiments, at least one of subprocesses 1411-1415 utilize such preferred form of semi-automated implementation.

Also depicted in FIG. 14 is an exemplary second pass process (920b) that functions principally to refine the adjustments and/or additions resulting from first pass 910b. In certain embodiments, exemplary process 920b may include one or more of:

refining (1421) adjustments (redispatch) to existing generation;
refining (1422) siting of new reactive power support devices;
refining (1423) siting of additional transmission and/or generation assets;
refining (1424) control setpoints of generation projects and/or mitigation devices;
refining (1425) transmission topology adjustments for feasible and reliable power flow.

In certain embodiments of process 920b, refining subprocesses 1422-1423 may involve pruning or removing certain facilities added in previous step(s). In one example, such pruning may comprise an automated process of removing redundant mitigation devices that were added through automated, computer-implemented previous mitigation step(s), such as 1411, 1412, and/or 1413. In certain embodiments, such automated (or semi-automated) pruning is further applied in accordance with and consideration of the capital and operating costs of newly added devices based on the brute-force pruning, sensitivity-based pruning, and MINLP algorithms described earlier.

Figure 15:
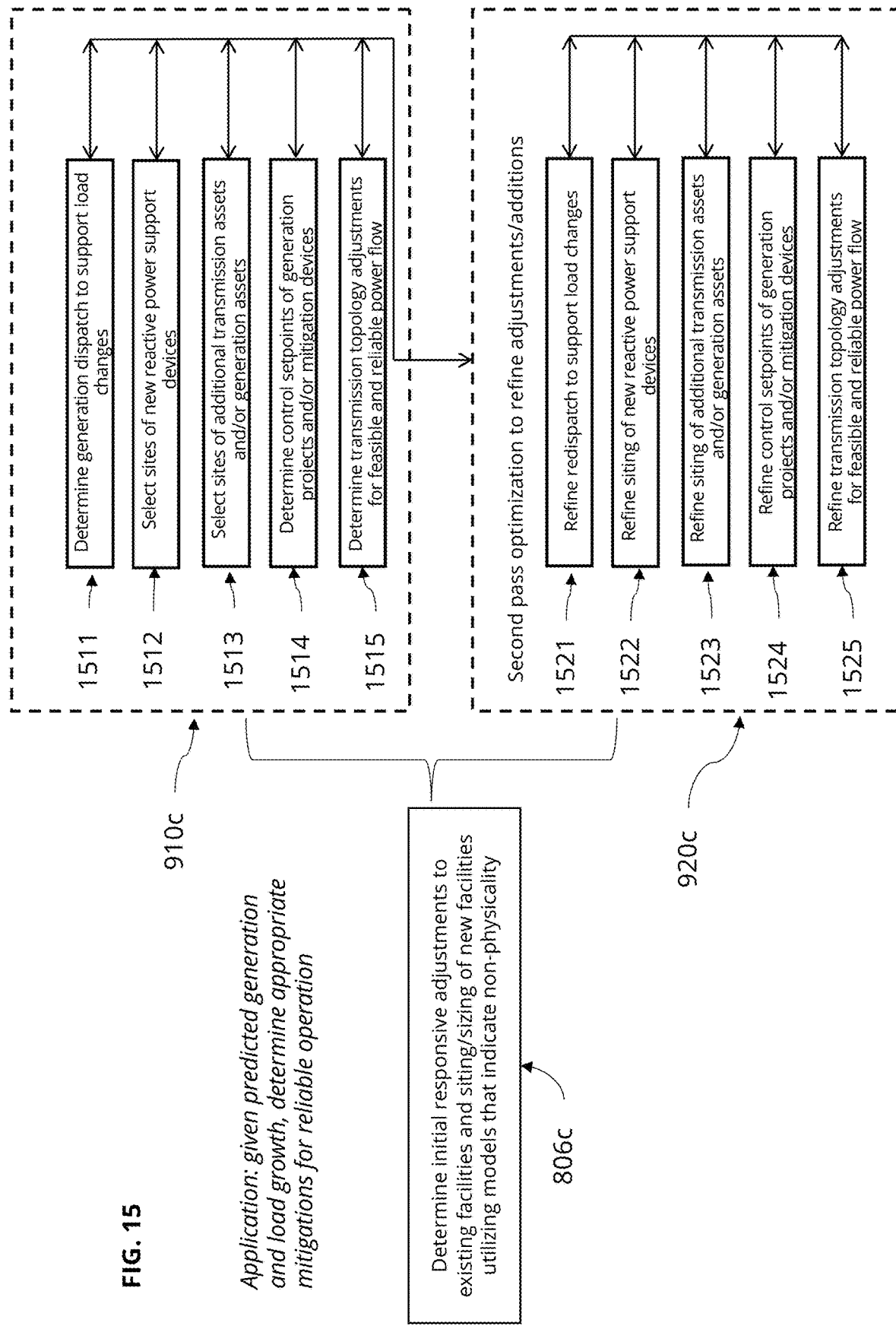
FIG. 15 contains a block diagram expanding the inventive process/system to determine initial responsive adjustments and/or additions of new facilities in response to growth of electrical generation and/or consumption (load)

Reference is now made to FIG. 15, which depicts aspects of a preferred process (806c) for determining initial responsive adjustments to existing facilities and/or siting/sizing of new facilities using models that tolerate non-physicality, for the purpose of facilitating a growth in power consumption and/or generation. Process (806c) preferably comprises a first pass phase (910c) and a second pass phase (920c), but both may be combined, or either may be omitted in certain embodiments of the invention.

Beginning with an example of process 910c, such first pass optimization preferably functions primarily to identify adjustments and/or additions to (or, in some cases, removal from) the power grid network and/or components thereof. In certain embodiments, process 910c may include one or more of:

determining (1511) the real power dispatch setpoints of other system generators to support the changes in power generation and/or consumption;
selecting (1512) sites of new reactive power support devices;

selecting (1513) sites of additional transmission assets and/or additional generation assets;

determining (1514) control set points of generation projects and/or mitigation devices;

determining (1515) transmission topology adjustments for feasible and reliable power flow.

For example, and without intending to be limiting, exemplary embodiments of process 910c might include:

subprocess 1511 and subprocess 1514 only;
subprocess 1512 and subprocess 1514 only;
subprocess 1513 and subprocess 1515 only;
subprocess 1512 and subprocess 1515 only.

In particular embodiments, any of subprocesses 1511-1515 may be configured or practiced as manual processes, semi-automated, computer-assisted processes, or fully automated, computer-implemented processes. In the case of semi-automated processes, such processes preferably involve use of graphical computer interfaces, in combination with selection devices, such as mice, pens, or touchscreens, to allow selection and/or parameterization of alternatives presented by the interface, in preferred embodiments, at least one of subprocesses 1511-1515 utilize such preferred form of semi-automated implementation.

Also depicted in FIG. 15 is an exemplary second pass process (920c) that functions principally to refine the adjustments and/or additions resulting from first pass 910c. In certain embodiments, exemplary process 920c may include one or more of:

refining (1521) adjustments (redispatch) to existing generation;

refining (1522) siting of new reactive power support devices;

refining (1523) siting of additional transmission and/or generation assets;

refining (1524) control setpoints of generation projects and/or mitigation devices;

refining (1525) transmission topology adjustments for feasible and reliable power flow.

In certain embodiments of process 920c, refining subprocesses 1522-1523 may involve pruning or removing certain facilities added in previous step(s). In one example, such pruning may comprise an automated process of removing redundant mitigation devices that were added through automated, computer-implemented previous mitigation step(s), such as 1511, 1512, and/or 1513. In certain embodiments, such automated (or semi-automated) pruning is further applied in accordance with and consideration of the capital and operating costs of newly added devices based on the brute-force pruning, sensitivity-based pruning, and MINLP algorithms described earlier.

Figure 16:
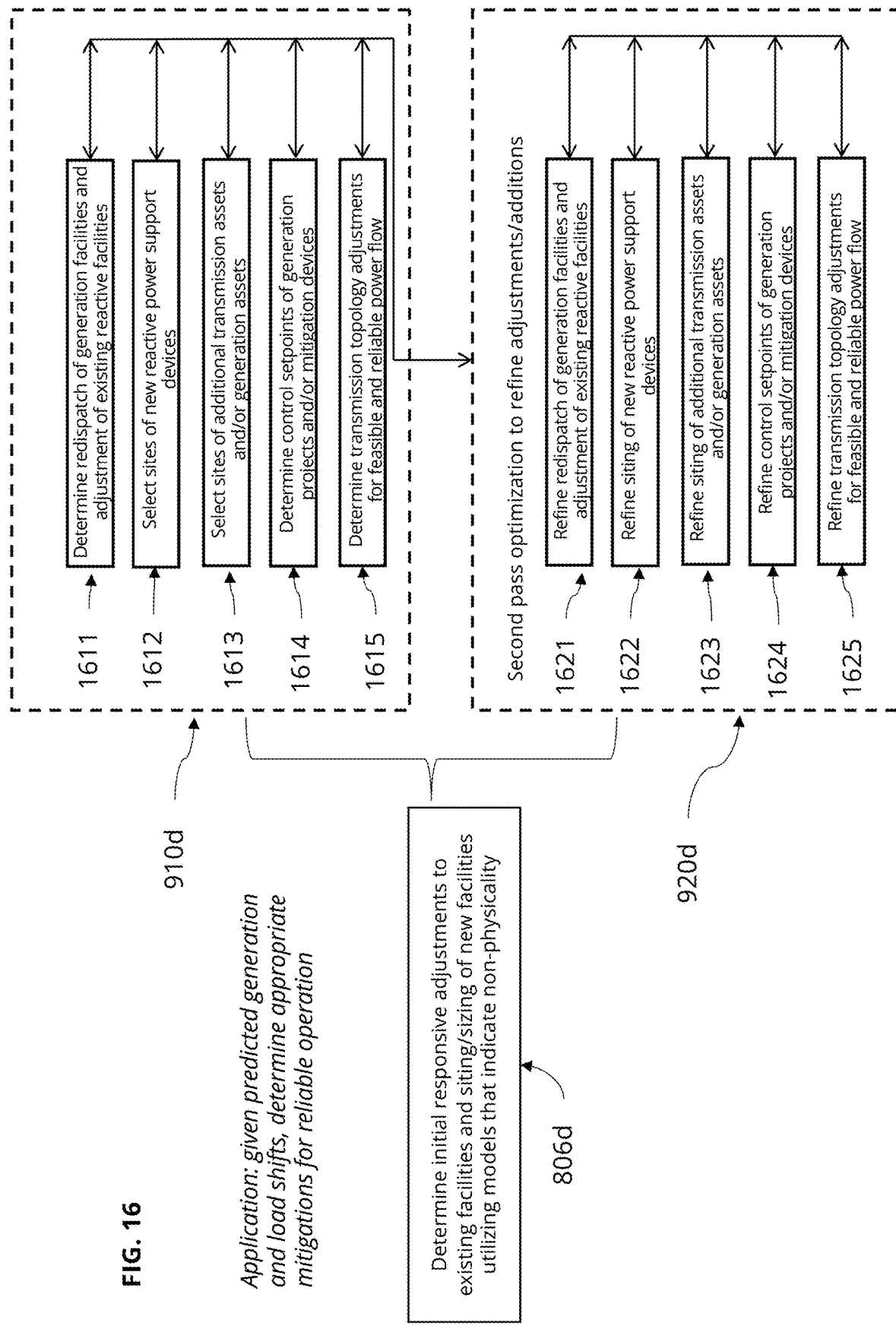
FIG. 16 contains a block diagram expanding the inventive process/system to determine initial responsive adjustments and/or additions of new facilities in response to regional shifts in electrical generation and/or consumption (load)

Reference is now made to FIG. 16, which depicts aspects of a preferred process (806d) for determining initial responsive adjustments to existing facilities and/or siting/sizing of new facilities using models that tolerate non-physicality, for the purpose of facilitating regional shifts in power consumption and/or generation. Process (806d) preferably comprises a first pass phase (910d) and a second pass phase (920d), but both may be combined, or either may be omitted in certain embodiments of the invention.

Beginning with an example of process 910d, such first pass optimization preferably functions primarily to identify adjustments and/or additions to (or, in some cases, removal from) the power grid network and/or components thereof. In certain embodiments, process 910d may include one or more of:

determining (1611) the real power dispatch setpoints of other system generators to support the shifts in power generation and/or consumption;

selecting (1612) sites of new reactive power support devices;

selecting (1613) sites of additional transmission assets and/or additional generation assets;

determining (1614) control set points of generation projects and/or mitigation devices;

determining (1615) transmission topology adjustments for feasible and reliable power flow.

For example, and without intending to be limiting, exemplary embodiments of process 910d might include:

subprocess 1611 and subprocess 1614 only;
subprocess 1612 and subprocess 1614 only;
subprocess 1613 and subprocess 1615 only;
subprocess 1612 and subprocess 1615 only.

In particular embodiments, any of subprocesses 1611-1615 may be configured or practiced as manual processes, semi-automated, computer-assisted processes, or fully automated, computer-implemented processes. In the case of semi-automated processes, such processes preferably involve use of graphical computer interfaces, in combination with selection devices, such as mice, pens, or touchscreens, to allow selection and/or parameterization of alternatives presented by the interface, in preferred embodiments, at least one of subprocesses 1611-1615 utilize such preferred form of semi-automated implementation.

Also depicted in FIG. 16 is an exemplary second pass process (920d) that functions principally to refine the adjustments and/or additions resulting from first pass 910d. In certain embodiments, exemplary process 920d may include one or more of:

refining (1621) adjustments (redispatch) to existing generation;

refining (1622) siting of new reactive power support devices;

refining (1623) siting of additional transmission and/or generation assets;

refining (1624) control setpoints of generation projects and/or mitigation devices;

refining (1625) transmission topology adjustments for feasible and reliable power flow.

In certain embodiments of process 920d, refining subprocesses 1622-1623 may involve pruning or removing certain facilities added in previous step(s). In one example, such pruning may comprise an automated process of removing redundant mitigation devices that were added through automated, computer-implemented previous mitigation step(s), such as 1611, 1612, and/or 1613. In certain embodiments, such automated (or semi-automated) pruning is further applied in accordance with and consideration of the capital and operating costs of newly added devices based on the brute-force pruning, sensitivity-based pruning, and MINLP algorithms described earlier.

Figure 17:
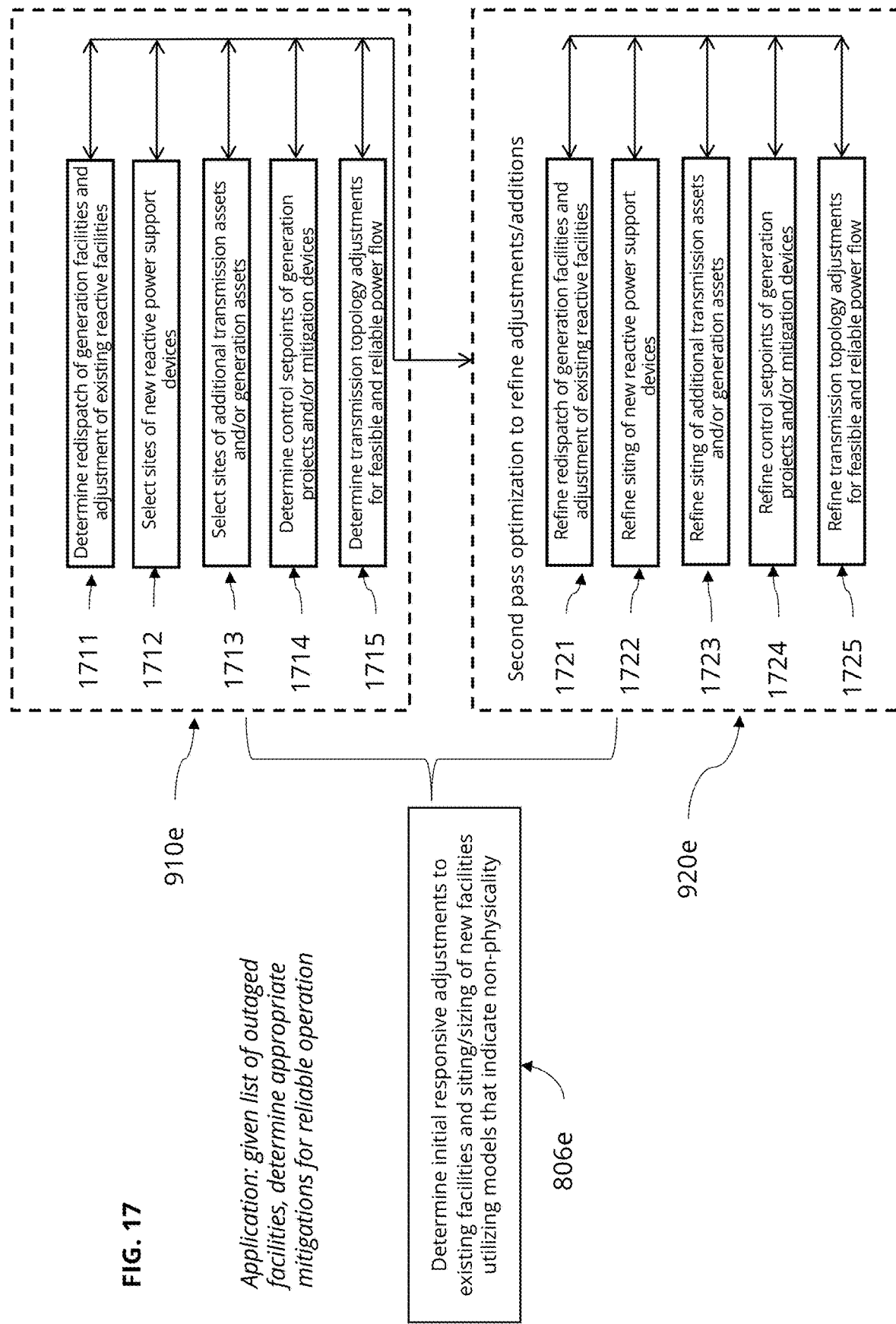
FIG. 17 contains a block diagram expanding the inventive process/system to determine initial responsive adjustments and/or additions of new facilities in response to one or more facilities undergoing an outage.

Reference is now made to FIG. 17, which depicts aspects of a preferred process (806e) for determining initial responsive adjustments to existing facilities and/or siting/sizing of new facilities using models that tolerate non-physicality, for the purpose of facilitating outages of one or more facilities. Process (806e) preferably comprises a first pass phase (910e) and a second pass phase (920e), but both may be combined, or either may be omitted in certain embodiments of the invention.

Beginning with an example of process 910e, such first pass optimization preferably functions primarily to identify adjustments and/or additions to (or, in some cases, removal from) the power grid network and/or components thereof. In certain embodiments, process 910e may include one or more of:

determining (1711) the real power dispatch setpoints of other system generators to support the loss of the retired units;

selecting (1712) sites of new reactive power support devices;

selecting (1713) sites of additional transmission assets and/or additional generation assets;

determining (1714) control set points of generation projects and/or mitigation devices;

determining (1715) transmission topology adjustments for feasible and reliable power flow.

For example, and without intending to be limiting, exemplary embodiments of process 910e might include:

subprocess 1711 and subprocess 1714 only;
  subprocess 1712 and subprocess 1714 only;
  subprocess 1713 and subprocess 1715 only;
  subprocess 1712 and subprocess 1715 only.

In particular embodiments, any of subprocesses 1711-1715 may be configured or practiced as manual processes, semi-automated, computer-assisted processes, or fully automated, computer-implemented processes. In the case of semi-automated processes, such processes preferably involve use of graphical computer interfaces, in combination with selection devices, such as mice, pens, or touchscreens, to allow selection and/or parameterization of alternatives presented by the interface, in preferred embodiments, at least one of subprocesses 1711-1715 utilize such preferred form of semi-automated implementation.

Also depicted in FIG. 17 is an exemplary second pass process (920e) that functions principally to refine the adjustments and/or additions resulting from first pass 910e. In certain embodiments, exemplary process 920e may include one or more of:

refining (1721) adjustments (redispatch) to existing generation;

refining (1722) siting of new reactive power support devices;

refining (1723) siting of additional transmission and/or generation assets;

refining (1724) control setpoints of generation projects and/or mitigation devices;

refining (1725) transmission topology adjustments for feasible and reliable power flow.

In certain embodiments of process 920e, refining subprocesses 1722-1723 may involve pruning or removing certain facilities added in previous step(s). In one example, such pruning may comprise an automated process of removing redundant mitigation devices that were added through automated, computer-implemented previous mitigation step(s), such as 1711, 1712, and/or 1713. In certain embodiments, such automated (or semi-automated) pruning is further applied in accordance with and consideration of the capital and operating costs of newly added devices based on the brute-force pruning, sensitivity-based pruning, and MINLP algorithms described earlier.

What is claimed is:

1. An automatic process for determining physical mitigation(s) to an original electrical power grid network in response to change(s) in one or more of (i) facility parameters, (ii) network topology, or (iii) additions or retirements of facilities, the method comprising at least the following steps:

(a) receiving information sufficient to determine topology and facility parameters of an altered network and determining the topology and facility parameters of the altered network by applying each of the change(s) (i)-(iii) to the original electrical power grid network;

(b) receiving information that indicates an operating state of the original electrical power grid network;

(c) determining data errors and configurations from the information received in (a) and (b) by (i) determining whether each facility parameter is outside of preselected facility parameter bounds and (ii) determining whether each operating state variable is outside of preselected operating state bounds;

(d) applying corrections to any data errors or configurations determined in (c);

(e) determining initial responsive adjustment(s) to the altered network using model(s) that tolerate at least one operational power limit through use of an augmented objective function wherein the at least one operational power limit comprises at least one of:

(i) facility operational limits, including (i)(a) generators supplying real power above their maximum real power limits or below their minimum real power limits and (i)(b) generators supplying reactive power above their maximum reactive power limits or below their minimum reactive power limits;

(ii) grid control parameters, including conflicting voltage set-points of two or more voltage-controlling facilities; or (iii) the network topology, including
    (iii)(a) transmission lines or transformer windings with unusually high series resistance or reactance that approaches an open circuit;
    (iii)(b) large shunt conductances to ground; or (iii)(c) abnormally high or low transformer turn ratios that force bus voltages outside their operational safety ratings; and wherein determining initial responsive adjustment(s) in step (e) further comprises:
      (e1) performing a first-pass optimization, using a model that tolerates non-physicality, to identify portion(s) of the altered network for parameter adjustment and/or deployment of additional facilities; and
      (e2) performing a second-pass optimization, also using a model that tolerates non-physicality, to refine the identified parameter adjustment(s) and/or newly deployed facilities;

(f) determining final responsive adjustment(s) to the altered network using actual AC power flow optimization; and (g) verifying the final responsive adjustment(s) using full AC simulation of the altered network with the final responsive adjustment(s) applied.

2. A process as defined in claim 1, wherein:
  (i) the preselected facility parameter bounds represent bounds on facility parameters; and
  (ii) preselected operating state bounds represent bounds on operating state variables.

3. A process as defined in claim 1, wherein determining configurations in step (c) comprises one or more of:
  (i) identifying conflicting control parameters;
  (ii) identifying conflicting transformer settings.

4. A process as defined in claim 1, wherein performing the first-pass optimization comprises determining first-pass adjustment(s) to existing facilities.

5. A process as defined in claim 4, wherein performing the first-pass optimization further comprises determining first-pass adjustments to the additionally deployed facilities.

6. A process as defined in claim 4, wherein performing the second-pass optimization comprises refining the first-pass adjustments(s) to existing facilities.

7. A process as defined in claim 6, wherein performing the second-pass optimization comprises:
   (i) refining the first-pass adjustments(s) to existing facilities; and
   (ii) refining the first-pass adjustments to the additionally deployed facilities.

8. A process as defined in claim 1, wherein:
   Step (e1) comprises instantiating a plurality of idealized compensatory elements at a plurality of points in the altered network; and
   Step (e2) comprises determining parameters for the compensatory elements that compensate for at least one element non physicality in the altered network.

9. A process as defined in claim 8, wherein step (e) further comprises:
   (e3) performing one or more pruning steps to reduce the number of compensatory elements in the altered network.

10. A process as defined in claim 9, wherein each pruning step eliminates one or more of the compensatory elements from the altered network and adjusts the parameters of other compensatory element(s) to reduce or eliminate at least one element in the altered network.

11. A process as defined in claim 9, wherein each pruning step eliminates one or more of the compensatory elements from the altered network and adjusts the parameters of other compensatory element(s) and/or the parameters of existing network facilities to reduce or eliminate at least one element in the altered network.

12. A process as defined in claim 9, wherein each pruning step selects one or more compensatory elements to eliminate based on an automated search process, guided by a cost function.

13. A process as defined in claim 12, wherein the cost function causes the search process to favor elimination of compensatory elements that provide the least amount of compensation in the altered network.

14. A process as defined in claim 9, wherein each pruning step eliminates one or more user-selected compensatory elements.

15. A process as defined in claim 9, wherein each pruning step prompts a user to select one or more compensatory elements for elimination based on a graphical representation of the altered network and costs associated with the compensatory elements.

16. A process as defined in claim 9, wherein each pruning step prompts a user to select one or more compensatory elements for elimination based on a graphical representation of the altered network and parameters associated with the compensatory elements.

17. An automatic process for determining physical mitigation(s) to an original electrical power grid network in response to change(s) in one or more of (i) facility parameters, (ii) network topology, or (iii) additions or retirements of facilities, the method comprising at least the following steps:
   (a) receiving information sufficient to determine topology and facility parameters of an altered network and determining the topology and facility parameters of the altered network by applying each of the change(s) (i)-(iii) to the original electrical power grid network;
   (b) receiving information that indicates an operating state of the original electrical power grid network;
   (c) determining data errors and configurations from the information received in (a) and (b) by (i) determining whether each facility parameter is outside of preselected facility parameter bounds and (ii) determining whether each operating state variable is outside of preselected operating state bounds;
   (d) applying corrections to any data errors or configurations determined in (c);
   (e) determining initial responsive adjustment(s) to the altered network using model(s) that tolerate at least one operational power limit through use of an augmented objective function, wherein the at least one operational power limit comprises at least one of:
   (i) facility operational limits, including (i)(a) generators supplying real power above their maximum real power limits or below their minimum real power limits and (i)(b) generators supplying reactive power above their maximum reactive power limits or below their minimum reactive power limits;
   (ii) grid control parameters, including conflicting voltage set-points of two or more voltage-controlling facilities; or
   (iii) the network topology, including
   (iii)(a) transmission lines or transformer windings with unusually high series resistance or reactance that approaches an open circuit;
   (iii)(b) large shunt conductances to ground; or (iii)(c) abnormally high or low transformer turn ratios that force bus voltages outside their operational safety ratings;
   and wherein determining initial responsive adjustment(s) in step (e) further comprises:
   (e1) performing a first-pass optimization, using a model that tolerates non-physicality, to identify portion(s) of the altered network for parameter adjustment and/or deployment of additional facilities; and
   (e2) performing a second-pass optimization, also using a model that tolerates non-physicality, to refine the identified parameter adjustment(s) and/or newly deployed facilities;
   (f) determining final responsive adjustment(s) to the altered network using actual AC power flow optimization; and
   (g) verifying the final responsive adjustment(s) using full AC simulation of the altered network with the final responsive adjustment(s) applied.

18. An automatic process for determining physical mitigation(s) to an original electrical power grid network in response to change(s) in one or more of (i) facility parameters, (ii) network topology, or (iii) additions or retirements of facilities, the method comprising at least the following steps:
   (a) receiving information sufficient to determine topology and facility parameters of an altered network and determining the topology and facility parameters of the altered network by applying each of the change(s) (i)-(iii) to the original electrical power grid network;
   (b) receiving information that indicates an operating state of the original electrical power grid network;
   (c) determining data errors and configurations from the information received in (a) and (b) by (i) determining whether each facility parameter is outside of preselected facility parameter bounds and (ii) determining whether each operating state variable is outside of preselected operating state bounds;

(d) applying corrections to any data errors or configurations determined in (c);
(e) determining initial responsive adjustment(s) to the altered network using model(s) that tolerates at least one operational power limit through use of an augmented objective function, wherein the at least one operational power limit comprises at least one of:
(i) facility operational limits, including (i)(a) generators supplying real power above their maximum real power limits or below their minimum real power limits and (i)(b) generators supplying reactive power above their maximum reactive power limits or below their minimum reactive power limits;
(ii) grid control parameters, including conflicting voltage set-points of two or more voltage-controlling facilities; or
(iii) the network topology, including
(iii)(a) transmission lines or transformer windings with unusually high series resistance or reactance that approaches an open circuit;
(iii)(b) large shunt conductances to ground; or (iii)(c) abnormally high or low transformer turn ratios that force bus voltages outside their operational safety ratings; and wherein determining initial responsive adjustment(s) in step (e) further comprises:
(e1) performing a first-pass optimization, using a model that tolerates non-physicality, to identify portion(s) of the altered network for parameter adjustment and/or deployment of additional facilities; and
(e2) performing a second-pass optimization, also using a model that tolerates non-physicality, to refine the identified parameter adjustment(s) and/or newly deployed facilities;
(f) determining final responsive adjustment(s) to the altered network using actual AC power flow optimization; and
(g) verifying the final responsive adjustment(s) using full AC simulation of the altered network with the final responsive adjustment(s) applied.

* * * * *